(12) United States Patent
Gardner et al.

(10) Patent No.: US 11,777,015 B2
(45) Date of Patent: Oct. 3, 2023

(54) MULTIPLE PLANES OF TRANSISTORS WITH DIFFERENT TRANSISTOR ARCHITECTURES TO ENHANCE 3D LOGIC AND MEMORY CIRCUITS

(71) Applicant: Tokyo Electron Limited, Tokyo (JP)

(72) Inventors: Mark I. Gardner, Cedar Creek, TX (US); H. Jim Fulford, Marianna, FL (US)

(73) Assignee: Tokyo Electron Limited, Tokyo (JP)

( * ) Notice: Subject to any disclaimer, the term of this patent is extended or adjusted under 35 U.S.C. 154(b) by 57 days.

(21) Appl. No.: 17/452,925

(22) Filed: Oct. 29, 2021

(65) Prior Publication Data

US 2022/0052186 A1 Feb. 17, 2022

Related U.S. Application Data

(62) Division of application No. 16/718,339, filed on Dec. 18, 2019, now Pat. No. 11,222,964.

(60) Provisional application No. 62/871,248, filed on Jul. 8, 2019.

(51) Int. Cl.
*H01L 29/66* (2006.01)
*H01L 29/417* (2006.01)
*H01L 21/8234* (2006.01)
*H01L 29/78* (2006.01)
*H01L 29/06* (2006.01)

(52) U.S. Cl.
CPC ........... *H01L 29/66795* (2013.01); *H01L 21/823431* (2013.01); *H01L 21/823437* (2013.01); *H01L 21/823462* (2013.01); *H01L 29/0669* (2013.01); *H01L 29/41791* (2013.01); *H01L 29/785* (2013.01); *H01L 2029/7858* (2013.01)

(58) Field of Classification Search
None
See application file for complete search history.

(56) References Cited

U.S. PATENT DOCUMENTS 8,580,624 B2 11/2013 Bangsaruntip et al.
8,809,957 B2 8/2014 Bangsaruntip et al.
9,443,949 B1 9/2016 Chang et al.
(Continued)

FOREIGN PATENT DOCUMENTS

KR 10-2019-0026018 A 3/2019

OTHER PUBLICATIONS

International Search Report and Written Opinion dated Sep. 28, 2020 in PCT/US2020/038044, 11 pages.

*Primary Examiner* — Michelle Mandala
*Assistant Examiner* — Jordan M Klein
(74) *Attorney, Agent, or Firm* — Oblon, McClelland, Maier & Neustadt, L.L.P.

(57) ABSTRACT

Microfabrication of a collection of transistor types on multiple transistor planes in which both HV (high voltage transistors) and LV (low-voltage transistors) stacks are designed on a single substrate. As high voltage transistors require higher drain-source voltages (Vds), higher gate voltages (Vg), and thus higher $V_t$ (threshold voltage), and relatively thicker 3D gate oxide thicknesses, circuits made as described herein provide multiple different threshold voltages devices for both low voltage and high voltage devices for NMOS and PMOS, with multiple different gate oxide thickness values to enable multiple transistor planes for 3D devices.

6 Claims, 19 Drawing Sheets

(56) References Cited

U.S. PATENT DOCUMENTS

| | | |
|---|---|---|
| 9,553,031 B1 | 1/2017 | Besser et al. |
| 9,564,502 B2 | 2/2017 | Chang et al. |
| 9,997,598 B2 | 6/2018 | Smith et al. |
| 10,453,850 B2 | 10/2019 | Smith et al. |
| 10,490,559 B1 * | 11/2019 | Ando ................. H01L 21/0262 |
| 10,510,620 B1 * | 12/2019 | Chanemougame .......................... H01L 27/0924 |
| 10,529,830 B2 | 1/2020 | Tapily et al. |
| 10,573,655 B2 | 2/2020 | Smith et al. |
| 2013/0105897 A1 | 5/2013 | Bangsaruntip et al. |
| 2014/0027855 A1 | 1/2014 | Bangsaruntip et al. |
| 2015/0179640 A1 | 6/2015 | Kim et al. |
| 2016/0284810 A1 | 9/2016 | Chang et al. |
| 2016/0359011 A1 | 12/2016 | Chang et al. |
| 2018/0026042 A1 | 1/2018 | Smith et al. |
| 2018/0040695 A1 | 2/2018 | Smith et al. |
| 2018/0047832 A1 | 2/2018 | Tapily et al. |
| 2018/0240802 A1 | 8/2018 | Smith et al. |
| 2019/0326301 A1 | 10/2019 | Smith et al. |
| 2020/0098897 A1 | 3/2020 | Tapily et al. |

\* cited by examiner

MULTIPLE PLANES OF TRANSISTORS WITH DIFFERENT TRANSISTOR ARCHITECTURES TO ENHANCE 3D LOGIC AND MEMORY CIRCUITS

CROSS REFERENCE TO RELATED PATENTS AND APPLICATIONS

This application is a division of U.S. application Ser. No. 16/718,339, filed Dec. 18, 2019, which claims priority to and the benefit of the filing date of U.S. Provisional Patent Application Ser. No. 62/871,248, filed Jul. 8, 2019, which application is incorporated herein by reference in its entirety.

BACKGROUND OF THE INVENTION

Field of the Invention

This disclosure relates to microelectronic devices including semiconductor devices, transistors, and integrated circuits, including methods of microfabrication of nano-channels with different threshold voltages, $V_t$.

Description of the Related Art

In the manufacture of a semiconductor device (especially on the microscopic scale), various fabrication processes are executed, such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts have run into greater challenges as scaling enters single digit nanometer semiconductor device fabrication nodes. Semiconductor device fabricators have expressed a desire for three-dimensional (3D) semiconductor circuits in which transistors are stacked on top of each other.

3D integration, i.e. the vertical stacking of multiple devices, aims to overcome the scaling limitations experienced in planar devices by increasing transistor density in volume rather than area. Although device stacking has been successfully demonstrated and implemented by the flash memory industry with the adoption of 3D NAND, application to random logic designs is substantially more difficult. 3D integration for logic chips (CPU (central processing unit), GPU (graphics processing unit), FPGA (field programmable gate array, SoC (system on a chip)) are under development in many applications.

Accordingly, it is one object of the present disclosure to provide architectures and methods for making a collection of transistor types on multiple transistor planes.

SUMMARY

Aspects of the present disclosure describe architectures and methods for making a collection of transistor types on multiple transistor planes. Many transistor circuit designs require both HV (high voltage transistors) and LV (low-voltage transistors) to integrate all the CMOS (complementary metal oxide semiconductor) logic circuits and elements. Typically high voltage transistors require higher drain-source voltages (Vds), higher gate voltages (Vg), and thus higher $V_t$ (threshold voltage), and relatively thicker gate oxide thicknesses. Additionally high voltage devices demand higher power requirements relative to the low-voltage devices. Circuits made as described herein can provide multiple different $V_t$ devices for both low voltage and high voltage devices for NMOS and PMOS, with multiple different gate oxide thickness values to enable multiple transistor planes for 3D devices.

An exemplary embodiment includes a method of microfabrication. A substrate is received having channels for gate-all-around field-effect transistor devices. The channels include vertical stacks of channels positioned adjacent to each other in which individual channels extend horizontally between source/drain regions. In the vertical stacks of channels at least one channel is positioned above a second channel. A dielectric is deposited on the channels to a first predetermined thickness. The dielectric is deposited all around a cross-section of the channels. A first portion of the channels is masked with a first etch mask, leaving a second portion of the channels being uncovered. Deposited dielectric is removed from the second portion of the channels. The first etch mask is removed so that the channels are uncovered. Depositing a high-k material on the channels. The high-k material is deposited all around the cross-section of the channels. The field-effect transistors using the first portion of channels have a greater threshold voltage as compared to field-effect transistors using the second portion of the channels.

In another exemplary embodiment, the channels are plasma doped before deposition of the oxides and high-k materials.

The order of discussion of the different steps as described herein has been presented for the sake of clarity. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. Additional details and/or possible perspectives of the invention and embodiments are presented in the detailed description section and corresponding figures of the present disclosure as further discussed below.

The foregoing general description of the illustrative embodiments and the following detailed description thereof are merely exemplary aspects of the teachings of this disclosure, and are not restrictive.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION

Figure 1:
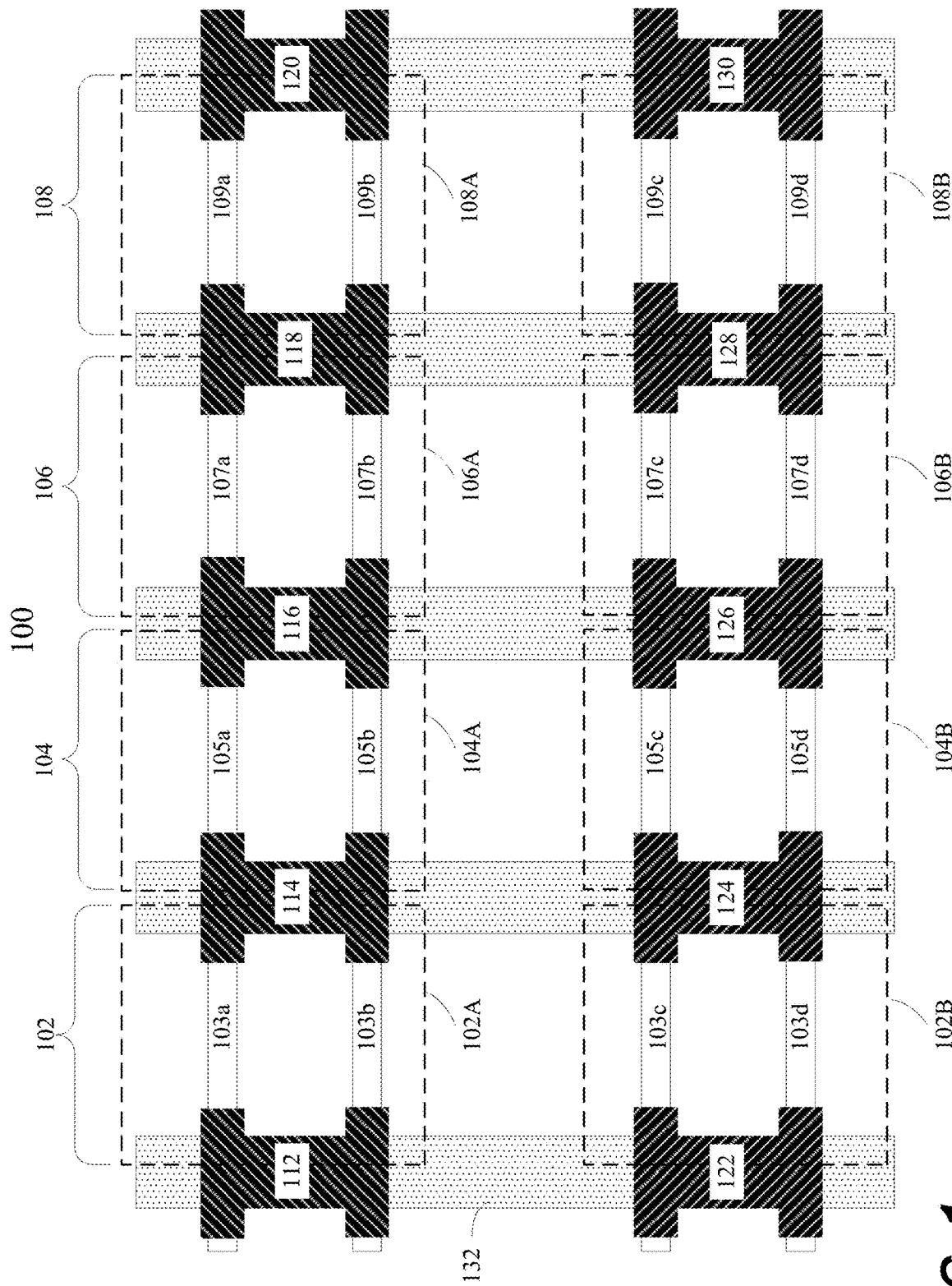
FIG. 1 is a cross-section of a 3D transistor array, according to certain embodiments.

In the drawings, like reference numerals designate identical or corresponding parts throughout the several views. Further, as used herein, the words "a," "an" and the like generally carry a meaning of "one or more," unless stated otherwise. The drawings are not generally drawn to scale unless specified otherwise or illustrating schematic structures or flowcharts.

Furthermore, the terms "approximately," "approximate," "about," and similar terms generally refer to ranges that include the identified value within a margin of 20%, 10%, or preferably 5%, and any values therebetween.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the apparatus in use or operation in addition to the orientation depicted in the figures. The apparatus may be otherwise oriented (rotated 90 degrees or at other orientations) and the spatially relative descriptors used herein may likewise be interpreted accordingly.

Reference throughout the specification to "one embodiment" or "an embodiment" means that a particular feature, structure, material, or characteristic described in connection with the embodiment is included in at least one embodiment, but do not denote that they are present in every embodiment. Thus, the appearances of the phrases "in one embodiment" in various places through the specification are not necessarily referring to the same embodiment. Furthermore, the particular features, structures, materials, or characteristics may be combined in any suitable manner in one or more embodiments.

A FinFET (fin field-effect transistor) is a type of non-planar transistor, or "2D" transistor. The FinFET is a variation on traditional metal oxide semiconductor field effect transistors (MOSFETs) distinguished by the presence of a thin silicon "fin" inversion channel on top of the substrate, allowing the gate to make two points of contact: the left and right sides of the fin. The thickness of the fin (measured in the direction from source to drain) determines the effective channel length of the device. The wrap-around gate structure provides better electrical control over the channel, reducing the leakage current and overcoming other short-channel effects.

A gate-all-around (GAA) FET, abbreviated GAAFET is similar in concept to a FinFET except that the gate material surrounds the channel region on all sides. Depending on design, gate-all-around FETs can have two or more effective gates. Gate-all-around FETs may utilize a stack of silicon nanowires with a gate completely surrounding it.

The gate-all-around assembly resembles a MOSFET, where a gate is sandwiched between the source and a drain and has fins similar to a FinFET. A gate-all-around FET may incorporate three or more nanowires. The nanowires, which form the channels, are suspended and run from the source to the drain.

Aspects of the present disclosure include devices and methods for fabricating transistors with multiple threshold voltages at various locations across a substrate. This allows for the design of chips with gate-all-around (GAA) transistors having different threshold voltages at different coordinate locations in both the horizontal direction and the vertical direction. That is, GAA transistors herein can be either low-voltage devices or high voltage devices in the x-y plane or the z plane. An aspect includes forming a dual gate oxide thickness for low-voltage and high voltage regions. Methods include selectively growing oxide on a portion of GAA channels and/or selectively removing gate oxide depositions from GAA channels. Other aspects include the selective doping of GAA channels.

Any suitable method can be applied to form the depositions. For example, the method can include chemical vapor deposition (CVD), physical vapor deposition (PVD), diffusion, atomic layer deposition (ALD), low pressure CVD, or other suitable deposition methods.

Voltage threshold is affected by different doping profiles of channels as well as gate oxide thickness and high-K materials. Generally, increasing a thickness of a gate oxide increases the $V_t$ of the corresponding transistor. Low-voltage devices can function with lower $V_{ds}$ or drain voltage of less than 1V or approximately 1V, while high voltage devices are typically greater than approximately 5 V. Also, gate voltage is larger in high voltage devices as compared to low voltage devices. High-voltage regions can have a larger voltage at the drain side of the transistor. For example, a drain side voltage of a high voltage device can be 5 V to 10 V, while the low voltage device may have a drain side voltage of approximately 1.0 V. Thus the gate oxide must be robust and reliable as a thicker gate oxide is required.

Many circuit designs call for multiple different low voltage and high voltage devices, with different $V_t$ values for each with increments of 0.3 V, though this can vary greatly depending on a transistor. For example, a low voltage device may have three low $V_t$ values of 0.3 V, 0.6 V, 0.9 V. By using both gate oxide thickness and channel doping, these values (or other values) can be obtained. Also, methods herein include using any combination of $V_{ds}$ and $V_t$ values possible as needed for different circuit applications.

Referring now to FIG. 1, a cross-section is illustrated of a first aspect of a 3D transistor array 100. The array has stacks of source/drain regions connected by nano-channels. In this figure, 102, 104, 106 and 108 represent transistor stacks. For example, stack 102 includes two transistors, 102A and 102B. In the non-limiting example of FIG. 1, transistor 102A is an n-channel field effect transistor (NFET) and transistor 102B is a p-channel field effect transistor (PFET). However, in a second non-limiting example, the PFET may be stacked over the NFET. Additionally, although only two transistor pairs (comprising NFET transistor 102A and PFET transistor 102B) are shown in stack 102, there may be three or more transistor pairs in each stack. For example, there may be 4, 6, 8 or 10 transistor pairs.

Each NFET transistor 102A includes a source/drain region 112 and a source/drain region 114 connected by two nano-channels 103a and 103b as shown in FIG. 1 for the first transistor 102A. In this configuration, the source/drain region 114 acts as a drain for transistor 102A and as a source for transistor 104A. The source and drain designations may be reversed, depending on the needs of the application. Additionally, each nano-channel 103a is spaced from the adjacent nano-channel 103b. Similarly, transistor 104A includes source 114, drain 116 and channels 105a, 105b; transistor 106A includes source 116, drain 118 and channels 107a, 107b; transistor 108A includes source 118, drain 120 and channels 109a, 109b. Each NFET transistor channel hangs between the source and the drain. The NFET channels each include at least one of silicon or germanium. Although FIG. 1 illustrates an NFET transistor 102A having two nano-channels, each NFET transistor may include N channels, where N is any one of 2 to 10 channels. The nano-channel herein means either a nano wire or a nano sheet shaped channel for a field effect transistor. The first source/drain (S/D) region and a second S/D region of each transistor may be made of a first material doped with phosphorous. The first S/D region and the second S/D region of the NFET transistor are positioned at two ends of the one or more first nano-channels and in direct contact with the one or more first nano-channels.

Nano-channel as used herein means either a nanowire or a nanosheet shaped channel for a field effect transistor. A nanowire is a relatively small elongated structure formed having a generally circular cross section or rounded cross section. Nanowires are formed from layers that are pattern etched to form a channel having a generally square cross-section, and then corners of this square cross-section structure are rounded, such as be etching, to form a cylindrical structure. A nanosheet is similar to a nanowire in that it is a relatively small cross section (less than a micron and typically less than 30 nanometers), but with a cross section that is rectangular. A given nanosheet can include rounded corners. During at least one point during the formation or processing of a nano-channel (wire or sheet), the given nano-channel is uncovered on all sides, including a bottom side. This differs from "planar" transistor channels which typically have at least one side that is on bulk silicon (or other material) and that always remains covered (another material in contact with it) during microfabrication. Planar channels enable a gate structure to essentially contact one side or two sides or three sides, but not all sides or surfaces. In contrast, nanowires and nanosheets enable gate-all-around (GAA) channels. Thus, a nano-channel herein can have various cross sections, but enables a gate to be formed all around the channel structure.

Each PFET transistor 102B includes a source/drain region 122 and a source/drain region 124 connected by two nano-channels 103c and 103d as shown in FIG. 1. In this configuration, the source/drain region 124 acts as a drain for transistor 102B and as a source for transistor 104B. The source and drain designations may be reversed, depending on the needs of the application. Additionally, each nano-channel 103c is spaced from the adjacent nano-channel 103d. Similarly, transistor 104B includes source 124, drain 126 and channels 105c, 105d; transistor 106B includes source 126, drain 128 and channels 107c, 107d; transistor 108B includes source 128, drain 130 and channels 109c, 109d. Similarly, each PFET transistor channel hangs between the source and the drain. Although FIG. 1 illustrates an PFET transistor 102B having two nano-channels, each PFET transistor may include M channels, where M is any one of 2 to 10 channels. A nano-channel herein means either a nano wire or a nano sheet shaped channel for a field effect transistor. The first source/drain (S/D) region and a second S/D region of each PFET transistor may be made of a first material and a second material doped with boron. The first material may be silicon. The second material can include at least one of GeSi, Ge, GePt, GeSiSn, GePtSi, GePt, SiGePt, SiGeSn, or SiGeSnPt. The first S/D region and the second S/D region of the NFET transistor are positioned at two ends of the one or more first nano-channels and in direct contact with the one or more first nano-channels.

Each NFET pair (102A, for example) is spaced from the corresponding PFET pair (102B, for example). The nano-channels are initially surrounded by dummy gate material as received, such as SiO or SiO2. Contacts and metallization are not shown in this figure.

In FIG. 1, the dummy gate material has been removed, leaving the channels of stacks 102, 104, 106 and 108 uncovered. The source/drain regions are supported by the remaining gate material 132. At this point, the process flow is focused on the replacement metal gate (RMG) steps to form gate oxides and work function metals.

Figure 2:
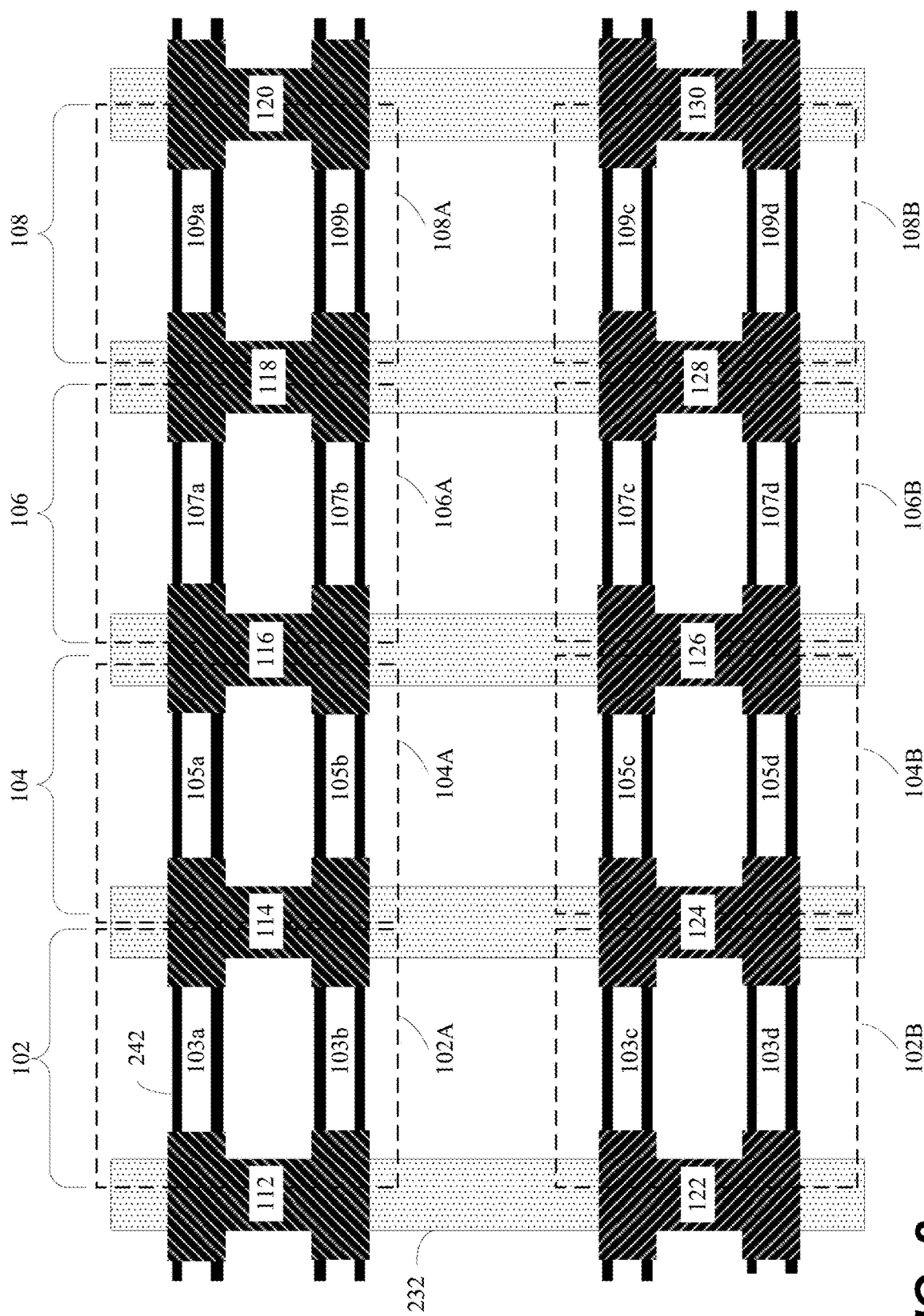
FIG. 2 illustrates the deposition of a first oxide on the channels of the 3D transistor array, according to certain embodiments.

With the channels uncovered, a first oxide 242 is deposited on all channels to a first predetermined thickness. This thickness can be a relatively thick deposition, such as is suitable for a high voltage transistor. The thick gate oxide may be a dielectric, such as silicon dioxide, $SiO_2$. An example is illustrated in FIG. 2 for transistor 102A.

Figure 3:
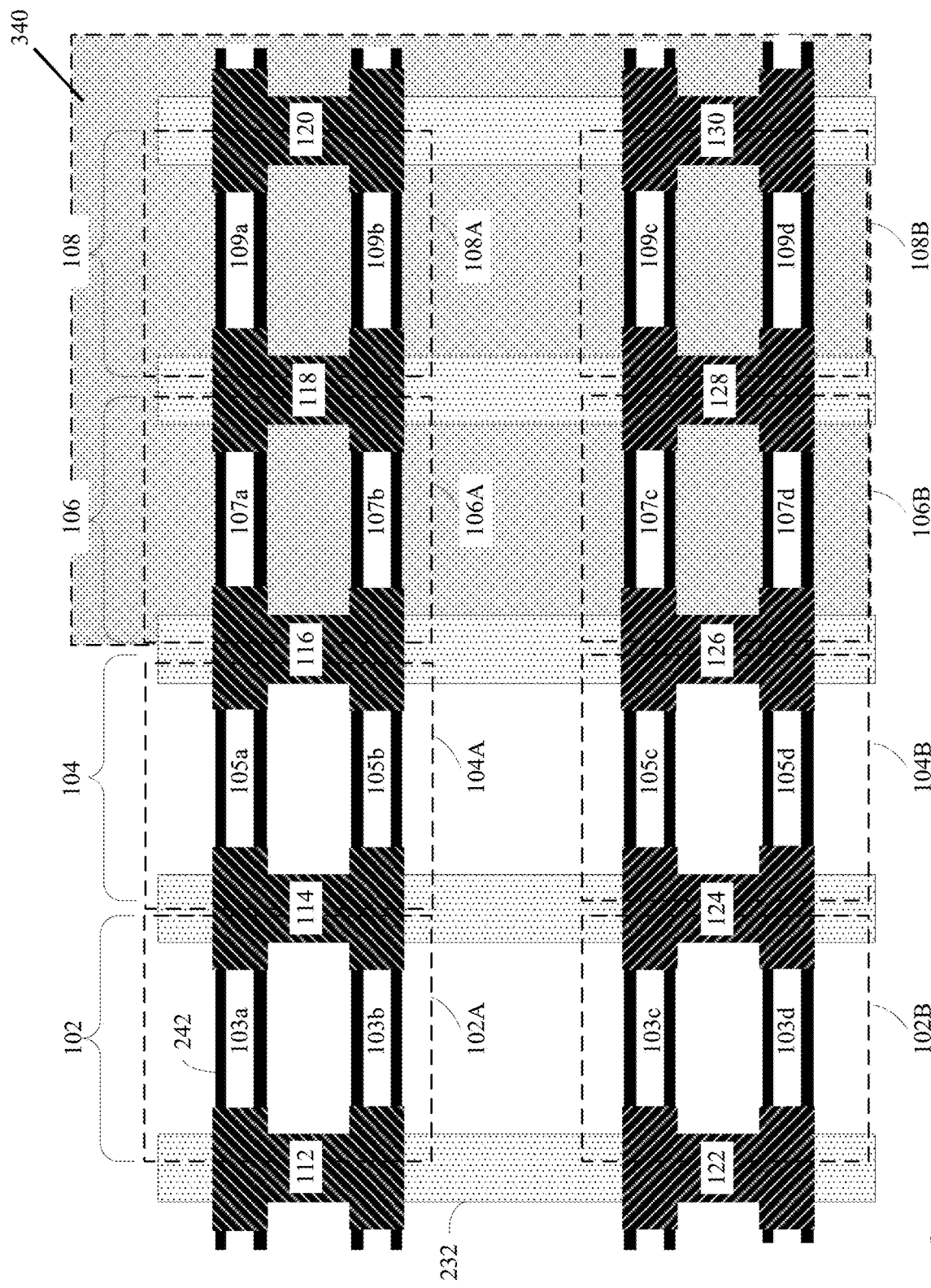
FIG. 3 shows the masking of high voltage transistors, according to certain embodiments.

Channels that are to be formed as high voltage transistors are then masked, such as with a photoresist etch mask 340 or other covering. An example result is illustrated in FIG. 3.

Figure 4:
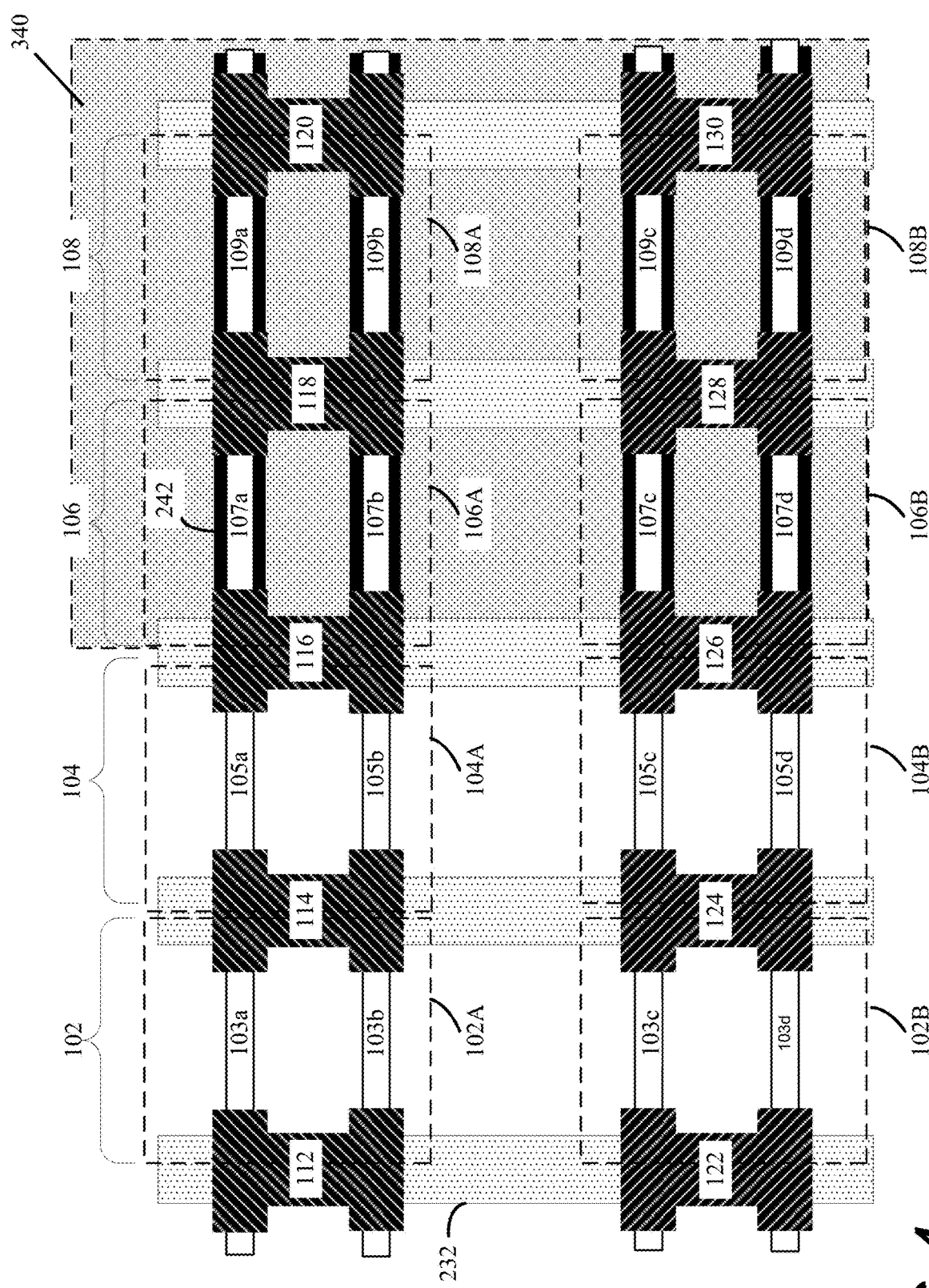
FIG. 4 shows the isotropic etching of the uncovered channels, according to certain embodiments.

With the high voltage channels covered, the initial (thick) gate oxide deposition is at least partially removed, such as with isotropic etching to remove the silicon dioxide from all around the unmasked channels. An example result is illustrated in FIG. 4 with the gate oxide removed from the unmasked channels (see channel 103a with the oxide removed, for example). Channels 107a-d, 109a-d still retain gate oxide 242. In other aspects, only a portion the gate oxide may be removed. Thus, the relatively thick gate oxide can be reduced to a relatively thin gate oxide.

Figure 5A:
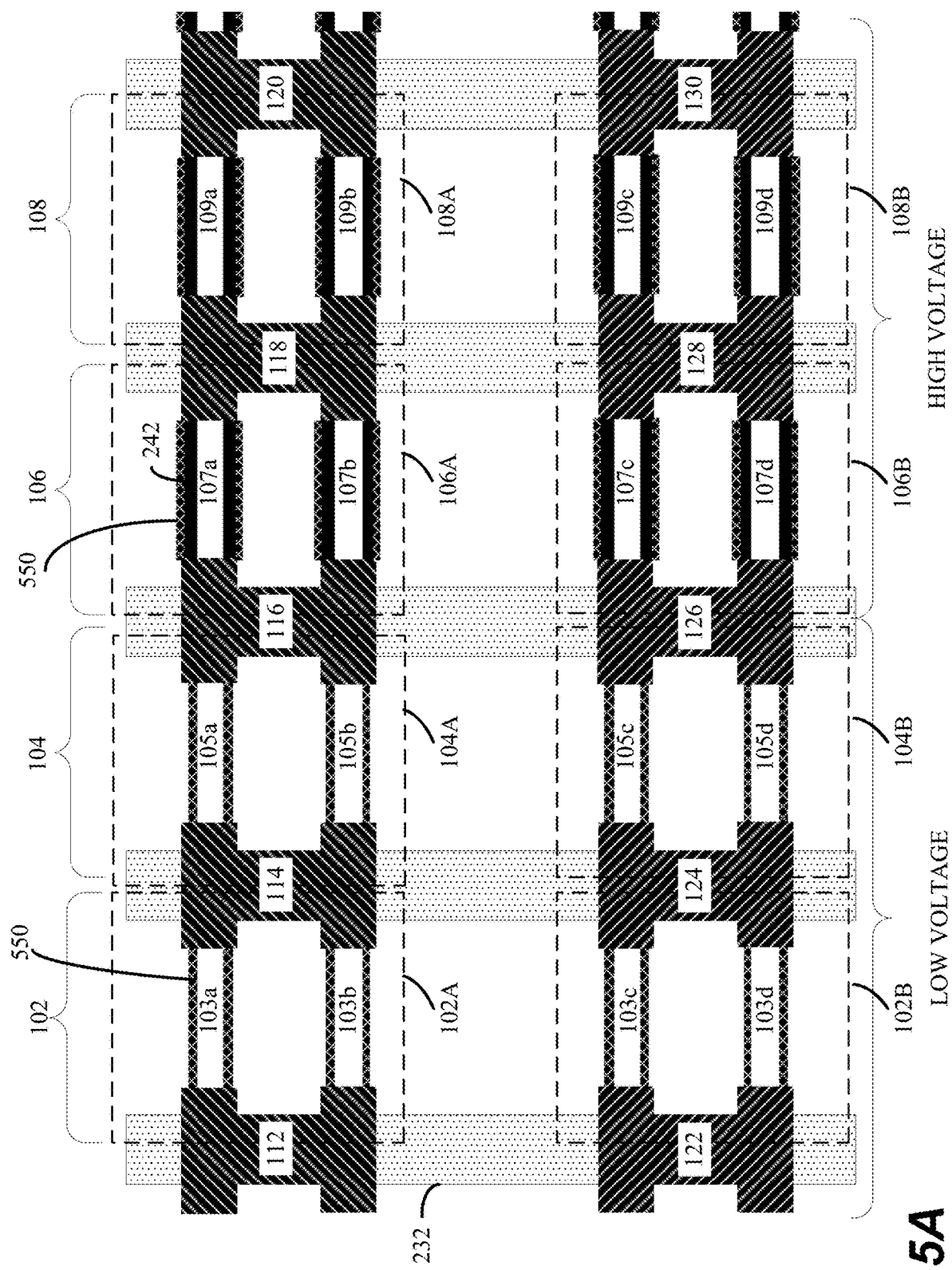
FIG. 5A illustrates the deposition of an interfacial dielectric layer on all channels, according to certain embodiments.
Figure 5B:
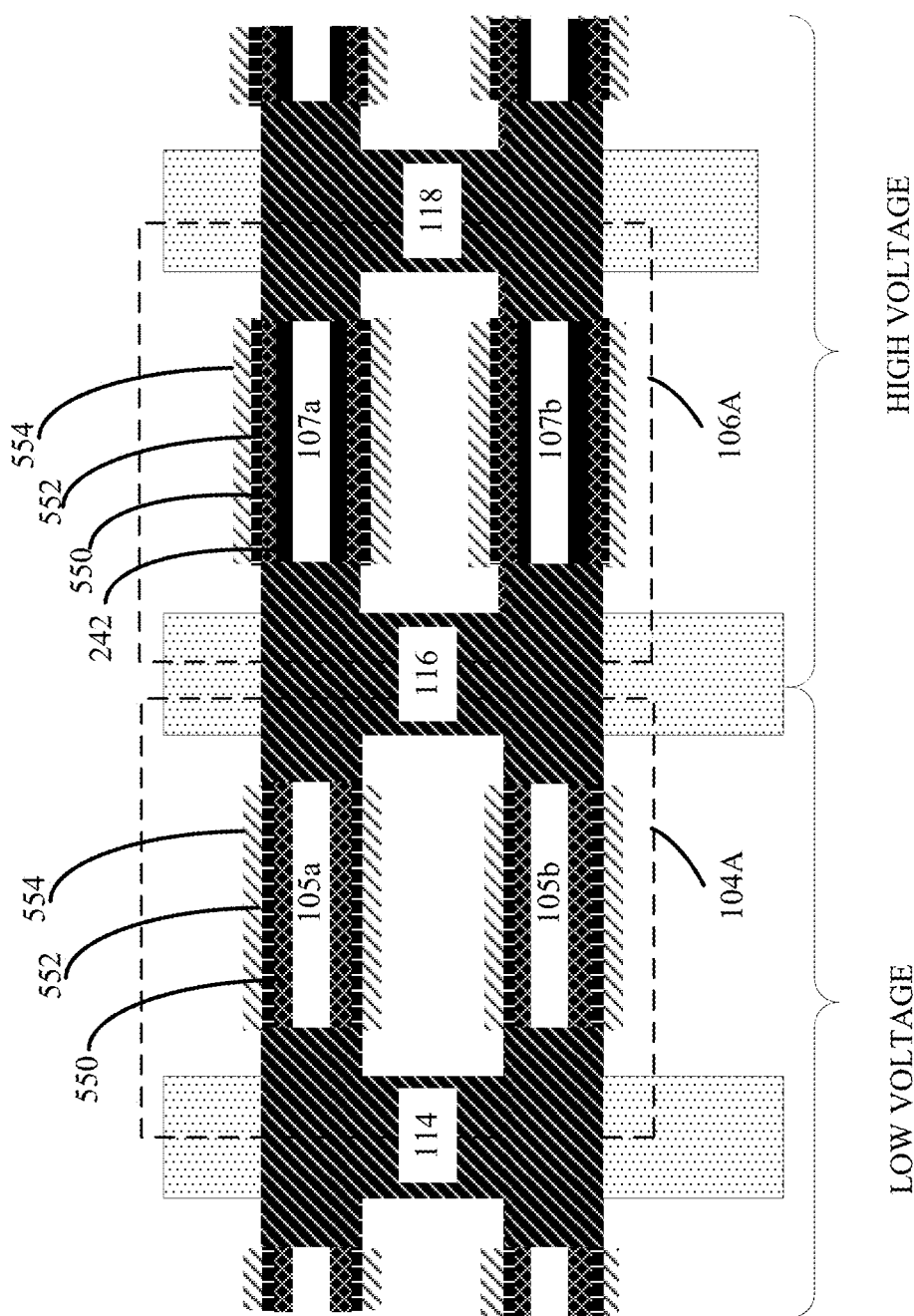
FIG. 5B depicts a magnified section of FIG. 5A.

The mask 440 covering the high voltage channels can then be removed. At this point additional processing steps can be continued. An interfacial dielectric (e.g., silicon dioxide) 550 layer may be deposited on the channels (all uncovered channels). An example result is shown in FIG. 5A. In this figure, transistors 102A, 104A, 102B and 104B act as low voltage transistors and transistors 106A, 108A, 106B and 108B act as high voltage transistors, due to the layer 242 of silicon dioxide on the high voltage channels. FIG. 5B shows a section of the transistors 104A and 106A which magnifies the depiction of the channel layers. High-k materials 552 and work function metals 554 can be deposited. Although not shown, local interconnects and metal levels can be fabricated (not shown). Transistor 104A acts as a low voltage transistor and transistor 106A acts as a high voltage transistor. The high-k layer 552 may be selected from the group comprising $HfO_2$, $Al_2O_3$, $Y_2O_3$, $ZrO_2$, $HfZrO_4$, $TiO_2$, $Sc_2O_3$, $La_2O_3$, $Lu_2O_3$, $Nb_2O_5$, $Ta_2O_5$. The work function metals 554 may include a TiN layer positioned over the high-k layer 552, a TaN layer positioned over the TiN layer, a TiON layer positioned over the TaN layer, and a TiC layer positioned over the TaN layer.

In a second aspect, a dual gate oxide thickness is formed on GAA channels including CFET (complementary FET) devices or side-by-side 3D FET devices.

Figure 6:
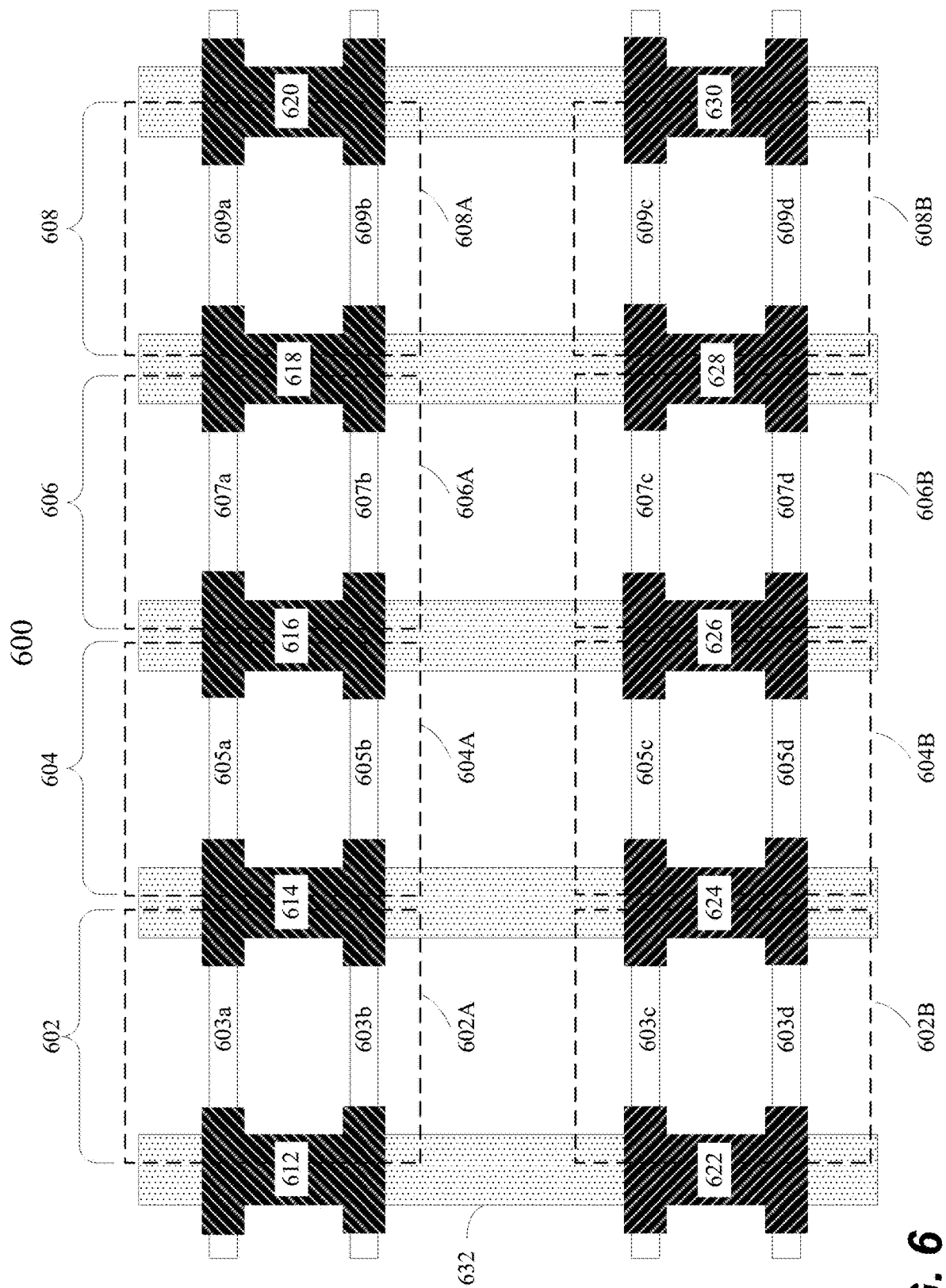
FIG. 6 is a cross-section of a 3D transistor array, according to certain embodiments.

Referring to FIG. 6, a cross-section is illustrated of a 3D transistor array. In this figure, dummy gate material has been removed, so channels (603a-d, 605a-d, 607a-d, 609a-d) are uncovered and silicon has been trimmed. The array has stacks of source/drain regions connected by nano-channels. In this figure, 602, 604, 606 and 608 represent transistor stacks. For example, stack 602 includes two transistors, 602A and 602B. In the non-limiting example of FIG. 6, transistor 602A is an NFET and transistor 602B is a PFET. However, in a second non-limiting example (not shown), the PFET may be stacked over the NFET. Additionally, although only two transistor pairs are shown in stack 602, there may be three or more transistor pairs in each stack. For example, there may be 4, 6, 8 or 10 transistor pairs. In this particular example, each set of two channels (603a, 603b, for example) are connected by corresponding source/drain regions (612, 614). At this point, the process flow is focused on the replacement metal gate (RMG) steps to form gate oxides and work function metals.

Each NFET transistor 602A includes a source/drain region 612 and a source/drain region 614 connected by two nano-channels 603a and 603b as shown in FIG. 6 for the first transistor 602A. In this configuration, the source/drain region 614 acts as a drain for transistor 602A and as a source for transistor 604A. The source and drain designations may be reversed, depending on the needs of the application. Additionally, each nano-channel 603a is spaced from the adjacent nano-channel 603b. Similarly, transistor 604A includes source 614, drain 616 and channels 605a, 605b; transistor 606A includes source 616, drain 618 and channels 607a, 607b; transistor 608A includes source 618, drain 620 and channels 609a, 609b. Each NFET transistor channel (603a, 603b, for example) hangs between the source and the drain. The NFET channels each include at least one of silicon or germanium. Although FIG. 6 illustrates an NFET transistor 602A having two nano-channels, each NFET transistor may include N channels, where N is any one of 2 To 10 channels. The nano-channel herein means either a nano wire or a nano sheet shaped channel for a field effect transistor. The first S/D region and the second S/D region of the NFET transistor are positioned at two ends of the one or more first nano-channels and in direct contact with the one or more first nano-channels.

Each PFET transistor 602B includes a source/drain region 622 and a source/drain region 624 connected by two nano-channels 603c and 603d as shown in FIG. 6. In this configuration, the source/drain region 624 acts as a drain for transistor 602B and as a source for transistor 604B. The source and drain designations may be reversed, depending on the needs of the application. Additionally, each nano-channel 603c is spaced from the adjacent nano-channel 603d. Similarly, transistor 604B includes source 624, drain 626 and channels 605c, 605d; transistor 606B includes source 626, drain 628 and channels 607c, 607d; transistor 608B includes source 628, drain 630 and channels 609c, 609d. Similarly, each PFET transistor channel hangs between the source and the drain. Although FIG. 6 illustrates an PFET transistor 602B having two nano-channels, each PFET transistor may include M channels, where M is any one of 2 to 10 channels. A nano-channel herein means either a nano wire or a nano sheet shaped channel for a field effect transistor. The first source/drain (S/D) region and a second S/D region of each PFET transistor may be made of a first material and a second material doped with boron. The first material may be silicon. The second material can include at least one of GeSi, Ge, GePt, GeSiSn, GePtSi, GePt, SiGePt, SiGeSn, or SiGeSnPt. The first S/D region and the second S/D region of the NFET transistor are positioned at two ends of the one or more first nano-channels and in direct contact with the one or more first nano-channels.

Each NFET pair (602A, for example) is spaced from the corresponding PFET pair (602B, for example). The nano-channels are initially surrounded by dummy gate material as received, such as SiO or SiO2. Contacts and metallization are not shown in this figure.

In FIG. 6, the dummy gate material has been removed, leaving the channels of stacks 602, 604, 606 and 608 uncovered. The source/drain regions are supported by the remaining gate material 632. At this point, the process flow is focused on the replacement metal gate (RMG) steps to form gate oxides and work function metals.

Figure 7:
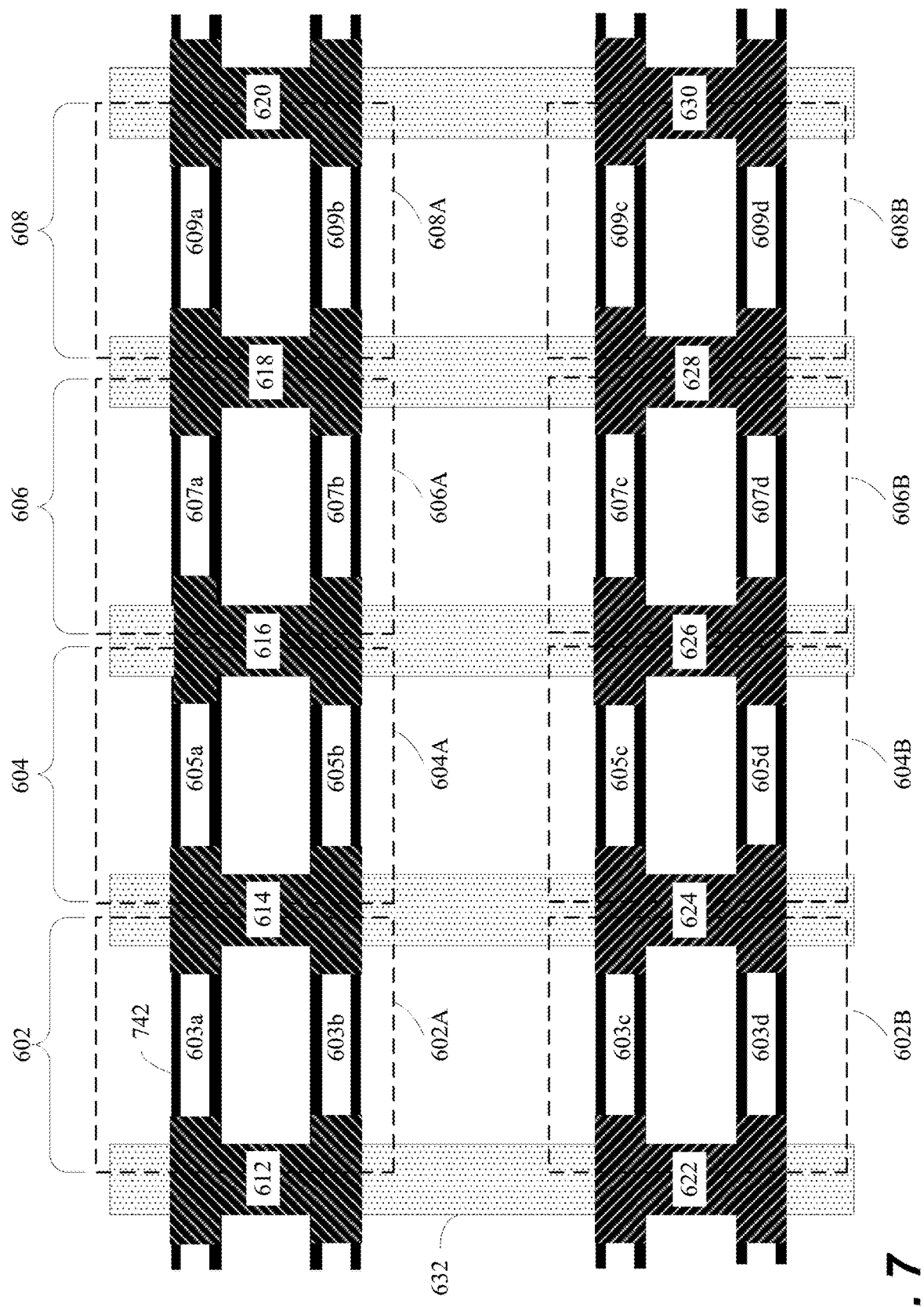
FIG. 7 illustrates the deposition of a first gate oxide on all channels of the 3D transistor array, according to certain embodiments, according to certain embodiments.

FIG. 7 illustrates the deposition of a thick gate oxide 742 on all uncovered channels to a first predetermined thickness. The thick gate oxide 742 may be $SiO_2$.

Figure 8:
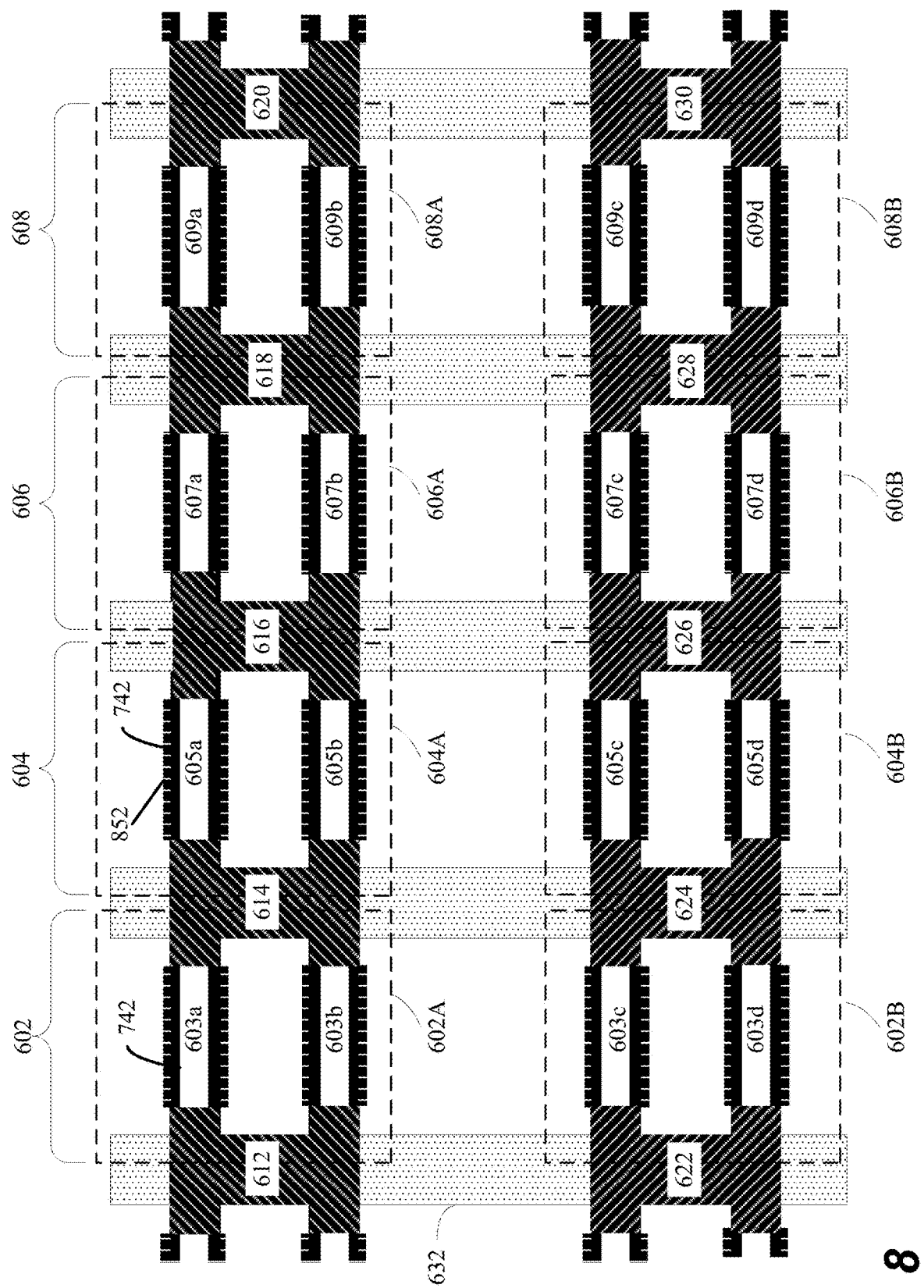
FIG. 8 illustrates the deposition of a high-k material over the first gate oxide, according to certain embodiments.

Next, a high-k material 852 is deposited on all GAA channels. An example result is illustrated in FIG. 8. In a non-limiting example, the high-k material may be hafnium oxide, $HfO_2$. The high-k layer 852 may be selected from any of the group comprising $HfO_2$, $Al_2O_3$, $Y_2O_3$, $ZrO_2$, $HfZrO_4$, $TiO_2$, $Sc_2O_3$, $La_2O_3$, $Lu_2O_3$, $Nb_2O_5$, $Ta_2O_5$. The high-k layer is preferably $HfO_2$.

Figure 9:
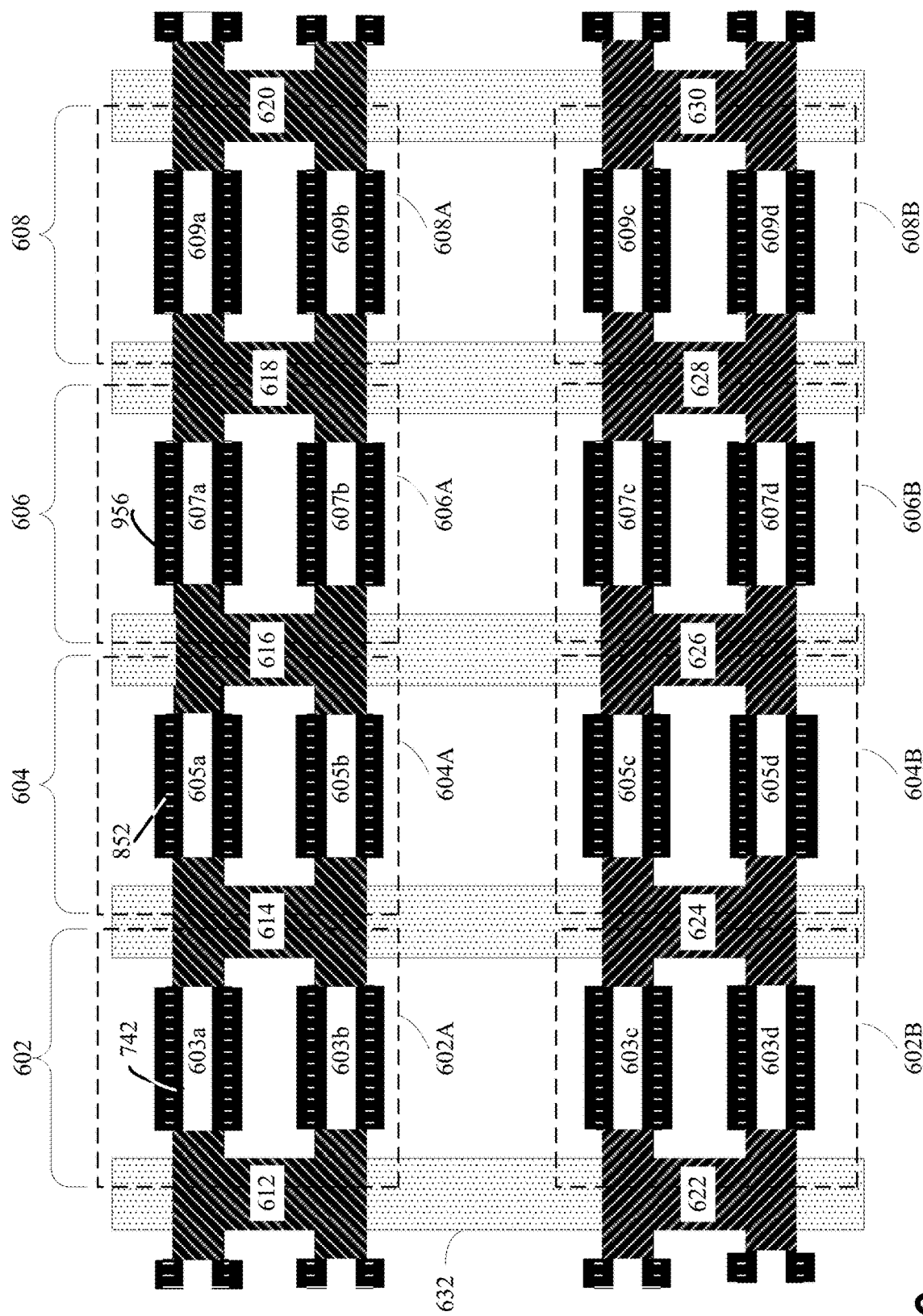
FIG. 9 illustrates the deposition of a second gate oxide over the high-k material, according to certain embodiments, according to certain embodiments.

A second gate oxide 956 is then deposited on all GAA channels. An example result is illustrated in FIG. 9.

Figure 10:
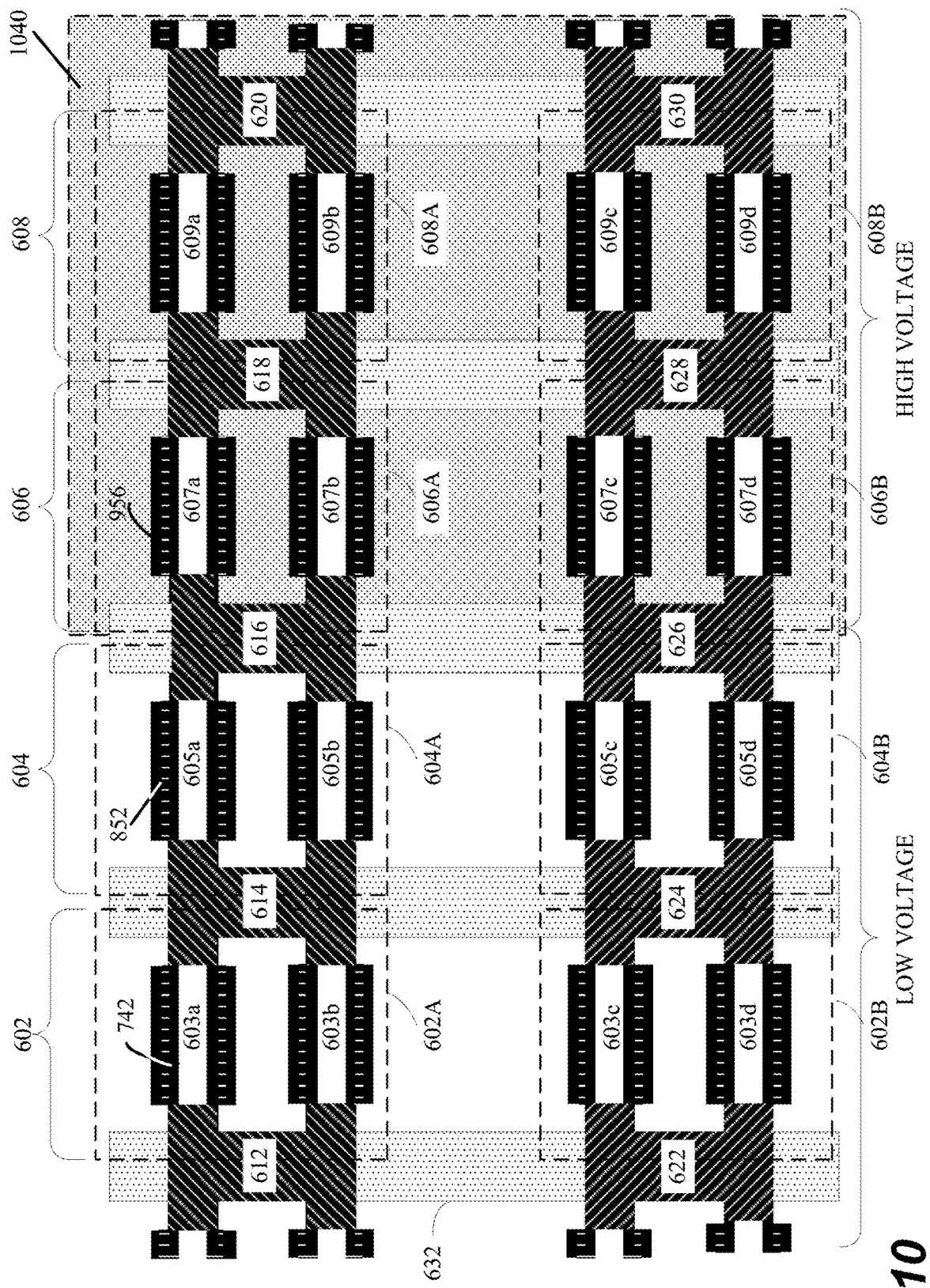
FIG. 10 is an illustration of masking the high voltage transistors, according to certain embodiments.

High-voltage channels (those channels designed to function as high voltage channels) are masked, such as with a photoresist etch mask 1040. An example result is illustrated in FIG. 10. The mask may be a mask stack which may include an amorphous Si (a-Si) layer that is positioned over the second gate oxide layer 956, an SiN layer and a resist layer (not shown).

Figure 11:
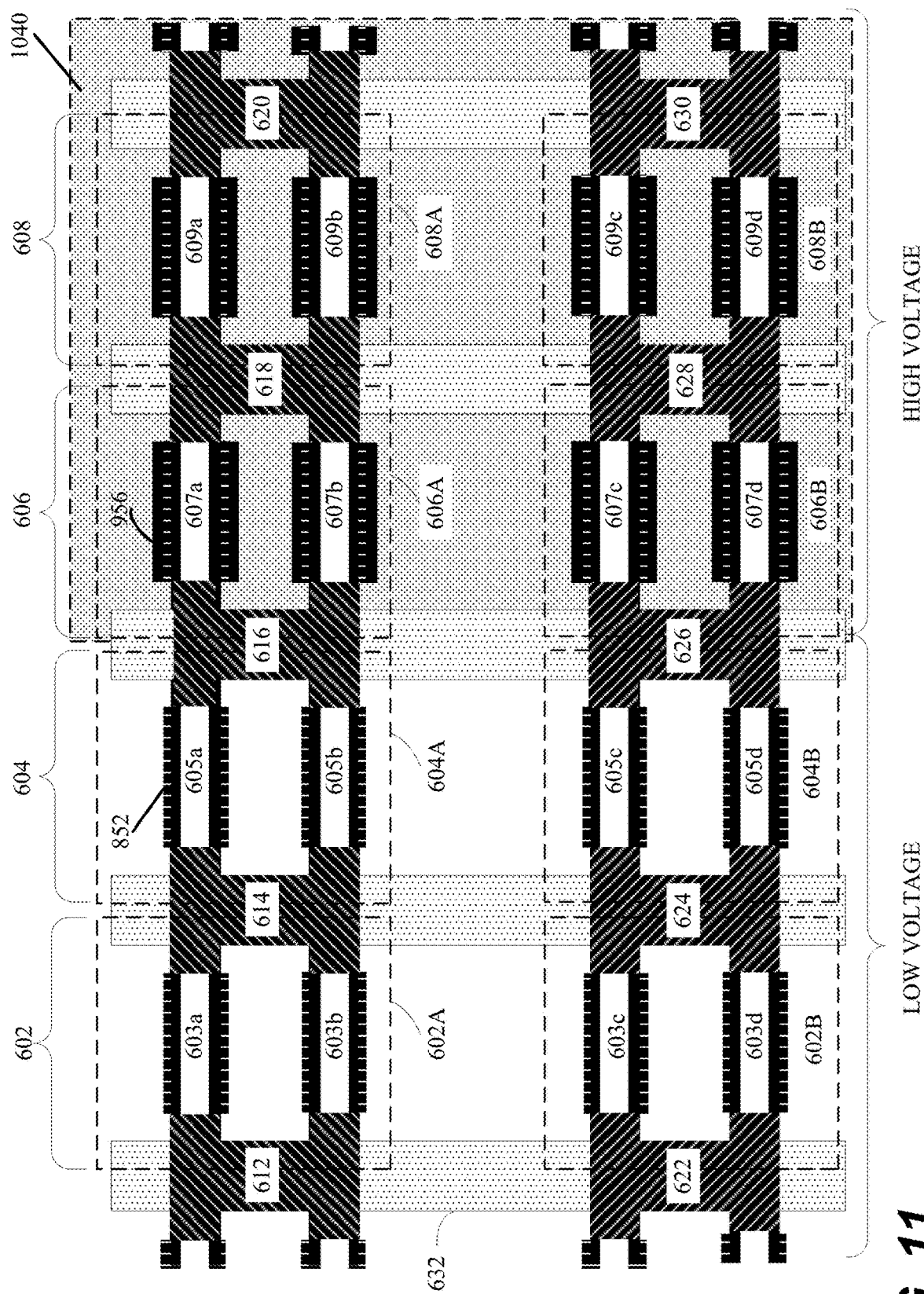
FIG. 11 illustrates the etching of the second gate oxide, according to certain embodiments.

With high voltage areas covered by the mask 1040, the second gate oxide deposition 956 is removed from the low voltage channels, such as by isotropic or vapor phase etching. An example result is illustrated in FIG. 11. The low voltages channels 603a-d, 605a-d still retain the high-k layer 852.

Figure 12A:
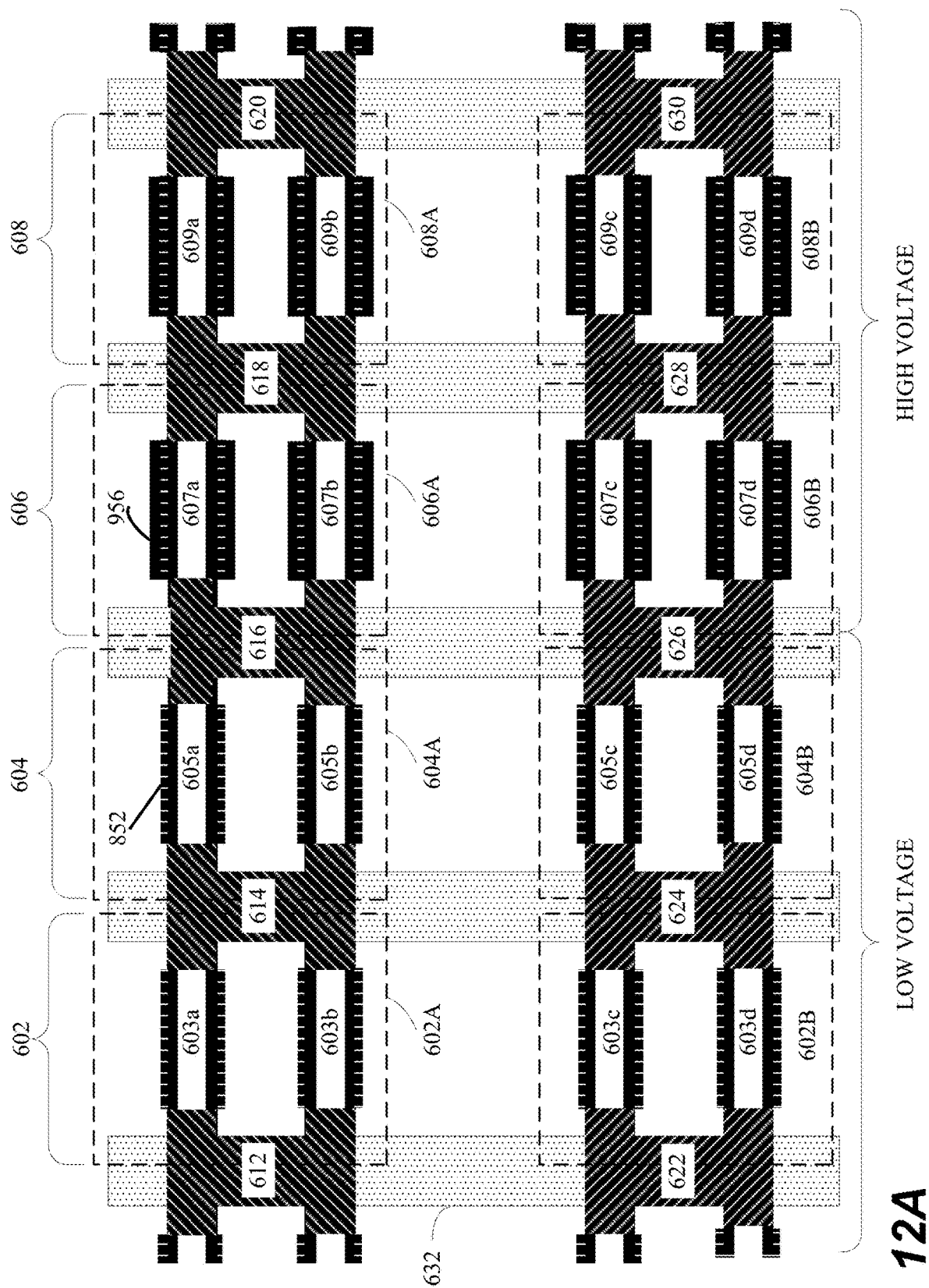
FIG. 12A illustrates the GAA transistor array with the masking of the high voltage transistors removed, according to certain embodiments.

Masking of high voltage areas can then be removed. The result is that a gate stack in the high voltage areas has a greater threshold voltage for activation. An example result is illustrated in FIG. 12A. Processing can continue with forming local interconnects and metal levels (not shown).

In a non-limiting example, each channel may have different oxides, $oxide_1$ and $oxide_2$ surrounding the high-k region, forming a gate stack of $oxide_1/HfO_2/oxide_2$ which is beneficial as high-k materials such as $HfO_2$ have good selectivity to oxide for precise thickness control. The oxides may differ by type or thickness. To speed the plasma processing of gate stacks, it is desirable to etch the entire stack using a single process. This requires a high selectivity for the oxide, in this case HfO$_2$, with respect to the underlying Si layer. Selectivity means the HfO$_2$ will be etched but the underlying Si will not be etched. Spacing between nanosheet planes can be increased depending on the gate oxide thickness needed for high voltage devices. Any high-k material can be used in addition to HfO$_2$. The high-k material may be any one of HfO$_2$, Al$_2$O$_3$, Y$_2$O$_3$ and ZrO$_2$, or the like.

The low voltage thickness of the stack is preferably in the range of 10-100 Angstroms, more preferably 10-75 Angstroms, most preferably 10-50 Angstroms. The high voltage thickness of the stack is preferably in the range of 80-300 Angstroms, more preferably 80-200 Angstroms, most preferably 100-200 Angstroms. The thicknesses are above are the equivalent oxide thickness, EOT, which is relative to SiO$_2$ equivalent EOT. However, since the high-K material has a higher K than SiO$_2$, a much thicker layer of high-K material must be used to get an SiO$_2$ equivalent. The equivalent oxide thickness is given by:

$$EOT = t_{high-K}\left(\frac{k_{SiO_2}}{k_{high-K}}\right)$$

This is beneficial to the operation of the device as the high-K material has lower tunneling current due to the thicker physical thickness. The thickness of the work function materials can range from 5-50 Angstroms.

Figure 12B:
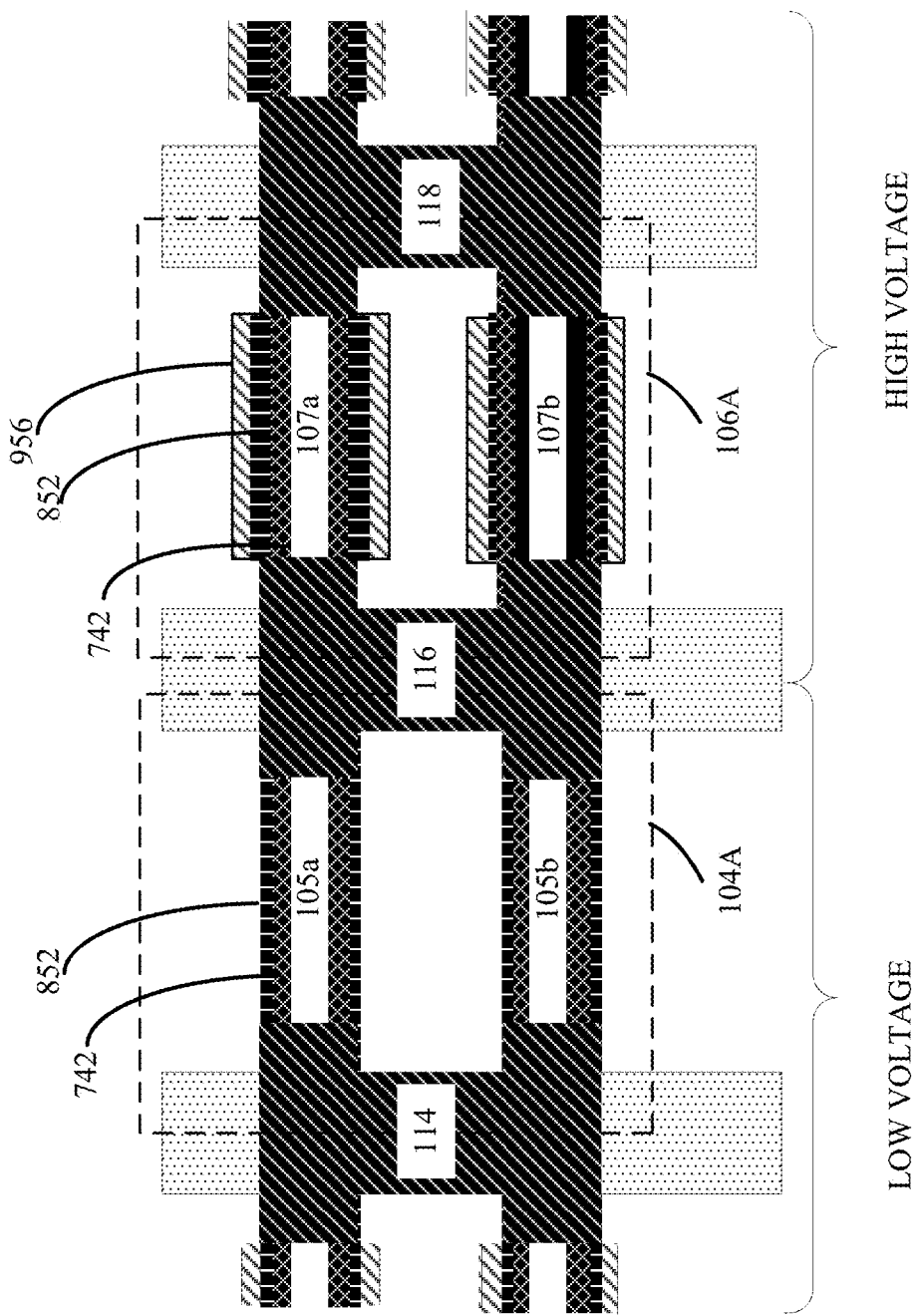
FIG. 12B depicts a magnified section of FIG. 12A.

FIG. 12B shows a section of the transistors 604A and 606A in a magnified depiction of the channel layers. High-k materials 552 and work function metals 554 can be deposited. Although not shown, local interconnects and metal levels can be fabricated (not shown). Transistor 104A acts as a low voltage transistor and transistor 106A acts as a high voltage transistor. The high-k layer 552 may be selected from one of the group comprising HfO$_2$, Al$_2$O$_3$, Y$_2$O$_3$ and ZrO$_2$, or the like. The work function metals 554 may include a TiN layer positioned over the high-k layer 552, a TaN layer positioned over the TiN layer, a TiON layer positioned over the TaN layer, a titanium aluminum, TiAl layer and a TiC layer positioned over the TaN layer.

Figure 13:
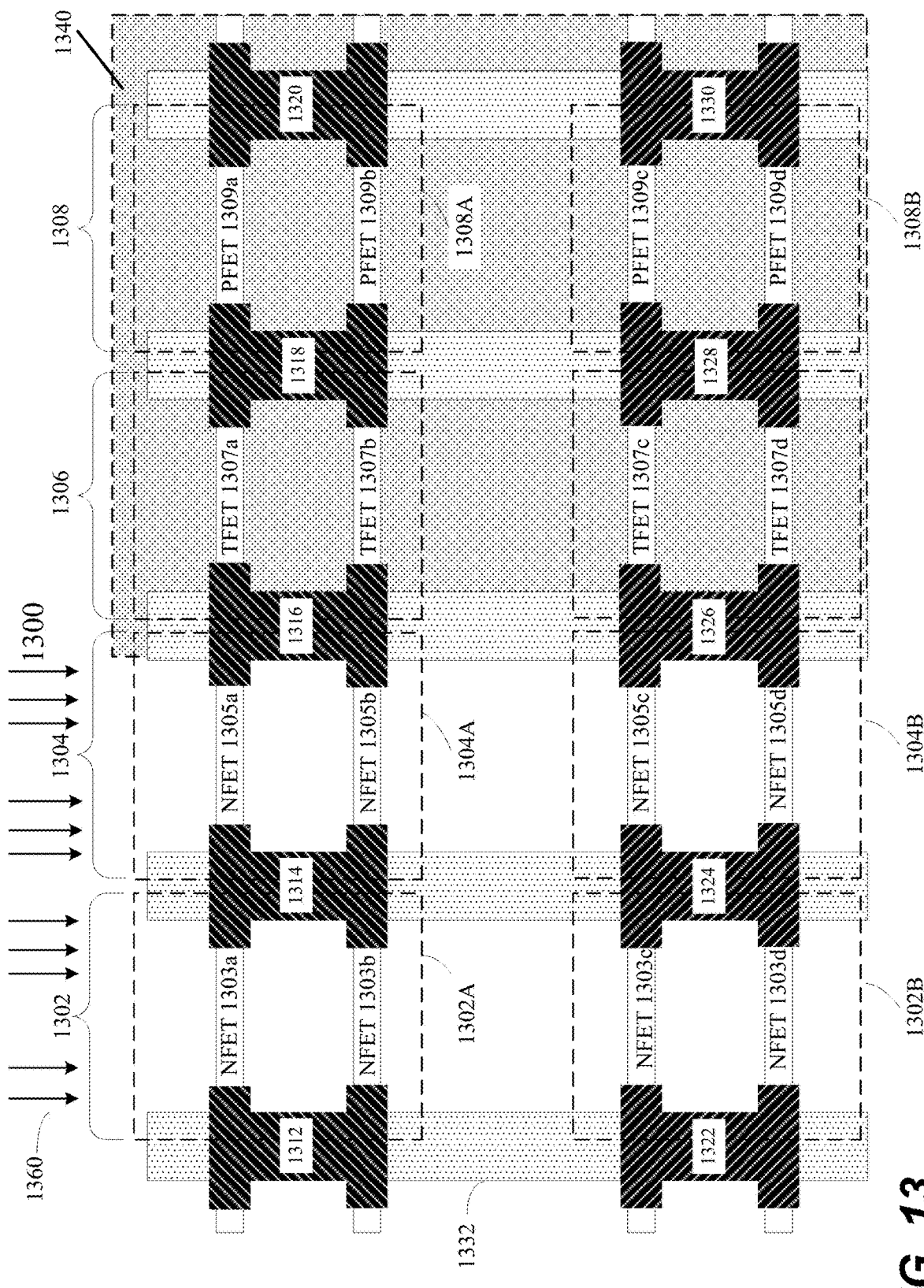
FIG. 13 a cross-section of a 3D transistor array with PFET transistors masked, according to certain embodiments.

A third aspect of the present disclosure includes a plasma-based doping (PLAD) step executed prior to the first oxide deposition of the gate oxide followed by an anneal and cleaning step. For plasma doping, a mask is used to uncover selected channels to receive the doping. The PLAD technology used with an NFET V$_t$ mask delivers a production proven method to rapidly implant over the entire wafer surface using a low energy process that will not disturb sensitive circuit features. At the point of plasma doping, the channels have been formed from bulk nanosheet stacks. In this aspect, it is more efficient to have an NMOS source/drain region on top of another NMOS source/drain region for process simplification or vice-versa for PMOS and TFET (i.e. same type of FET stack). S/D regions can be interchanged, which is described in more detail in U.S. Ser. No. 62/866,975, filed on Jun. 26, 2019, and titled "Multiple Nano Layer Transistor Layers with Different Transistor Architectures for Improved Circuit Layout and Performance." This enables N TFET (n-channel TFET), P TFET (p-channel TFET), TFET (intrinsic TFET) and a large combination of NMOS and PMOS symmetrical S/D regions for high voltage and low voltage devices with several different V$_t$ combinations per device. Plasma doping may be applied to any transistor type. An anneal after plasma doping is completed is an option. After the plasma doping/anneal steps, the gate oxide process is continued. An example showing the mask 1340 over the PFET transistors and the doping 1360 of the NFET transistors is illustrated in FIG. 13.

Figure 14:
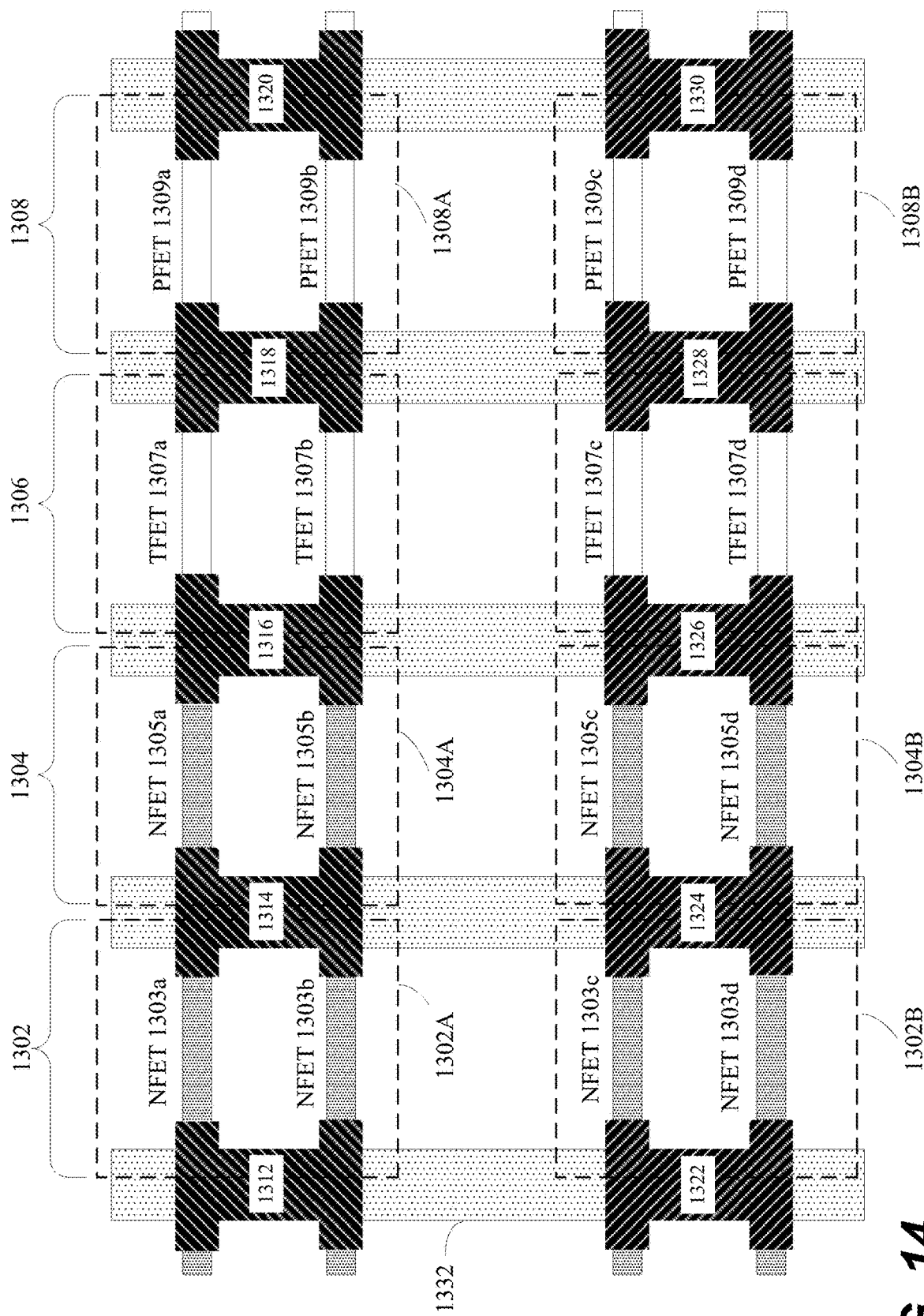
FIG. 14 illustrates the plasma doping of the NFET transistors with the PFET transistors masked, according to certain embodiments.

The NFET channels have now been doped and optionally annealed and the PFET channels are not doped. The first doping mask 1340 is then removed. An example result is illustrated in FIG. 14, in which the doping of the NFET channels is depicted by shading.

Figure 15:
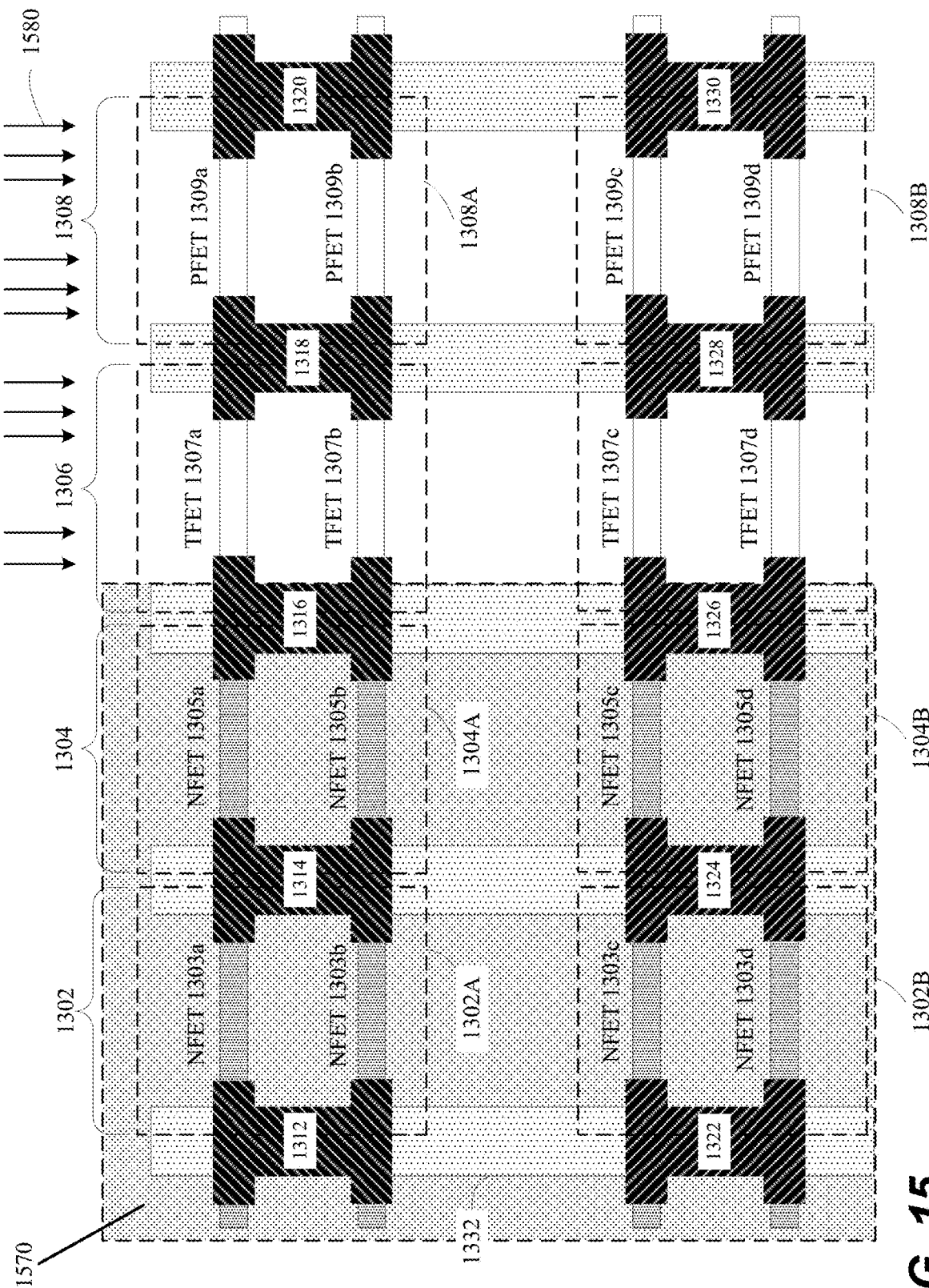
FIG. 15 illustrates the plasma doping of the PFET transistors with the NFET transistors masked, according to certain embodiments.

A second doping mask 1570 can be formed to cover NMOS regions while PMOS regions are doped with plasma doping 1580. An example showing the mask over the NFET transistors and the doping 1580 of the PFET transistors is illustrated in FIG. 15. This step may be followed by an optional annealing. Note that multiple masks may be used so that different PMOS doping profiles can be created. Likewise, different NMOS doping profiles can be created thereby creating GAA channels having different doping profiles.

The plasma doping files may be very abrupt and highly doped with low energy of 0.01 to 5 key, which are up to an order of magnitude lower than a conventional ion beam implanter. A phosphorous or arsenic implant used for N+ doping may have a plasma made from phosphine or arsine gas. For P+ doping the plasma may consist of boron. Due to the lower energy, very high concentrations are possible in the $5\times10^{15}$ to $5\times10^{16}$ ions/cm$^2$ for all species.

Figure 16:
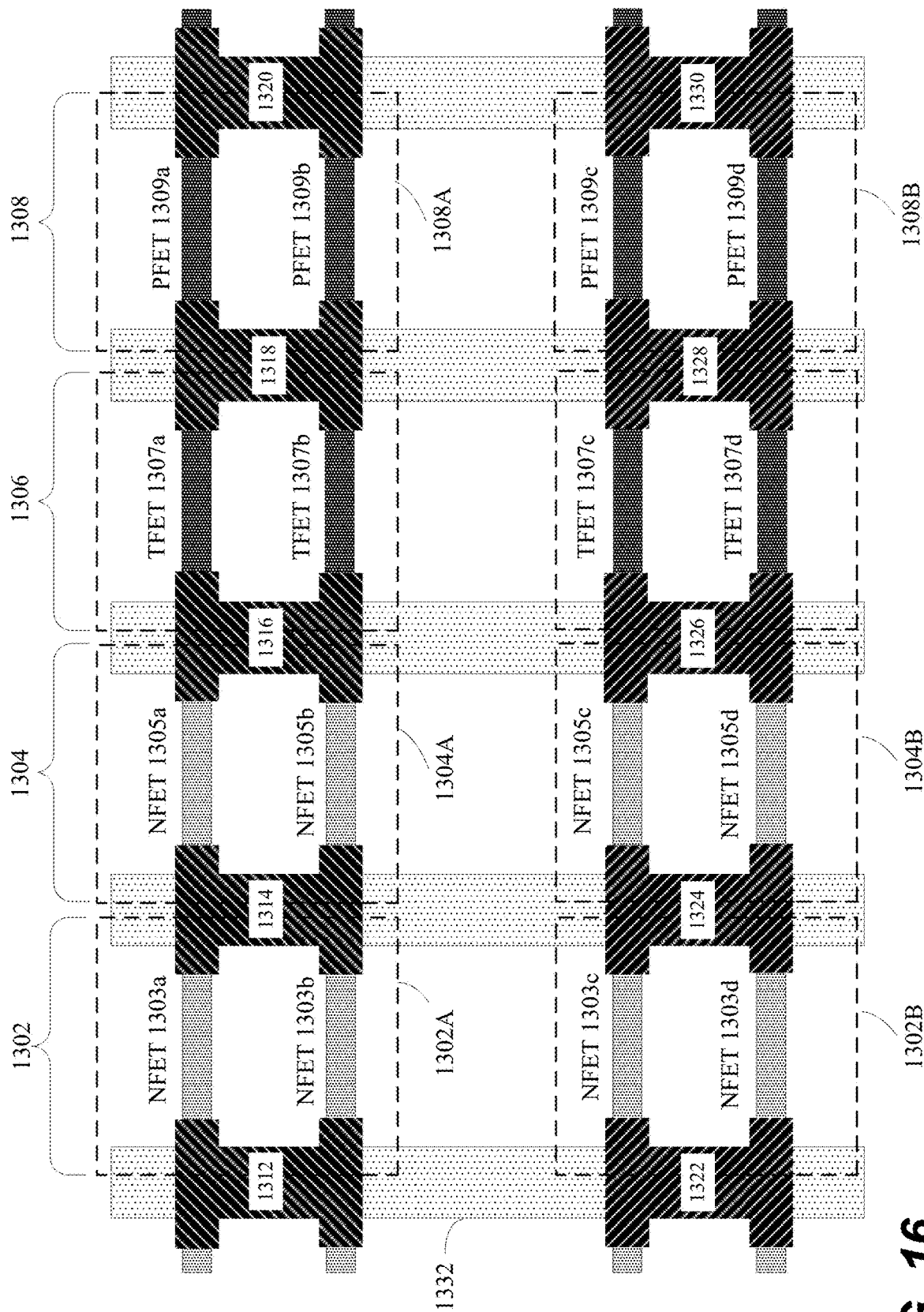
FIG. 16 illustrates the 3D transistor array with doped NFET and PFET channels.

FIG. 16 illustrates the doped NFET and PFET channels, with the PFET channels showing a different shading than the NFET channels indicating that the doping profiles are different.

Figure 17:
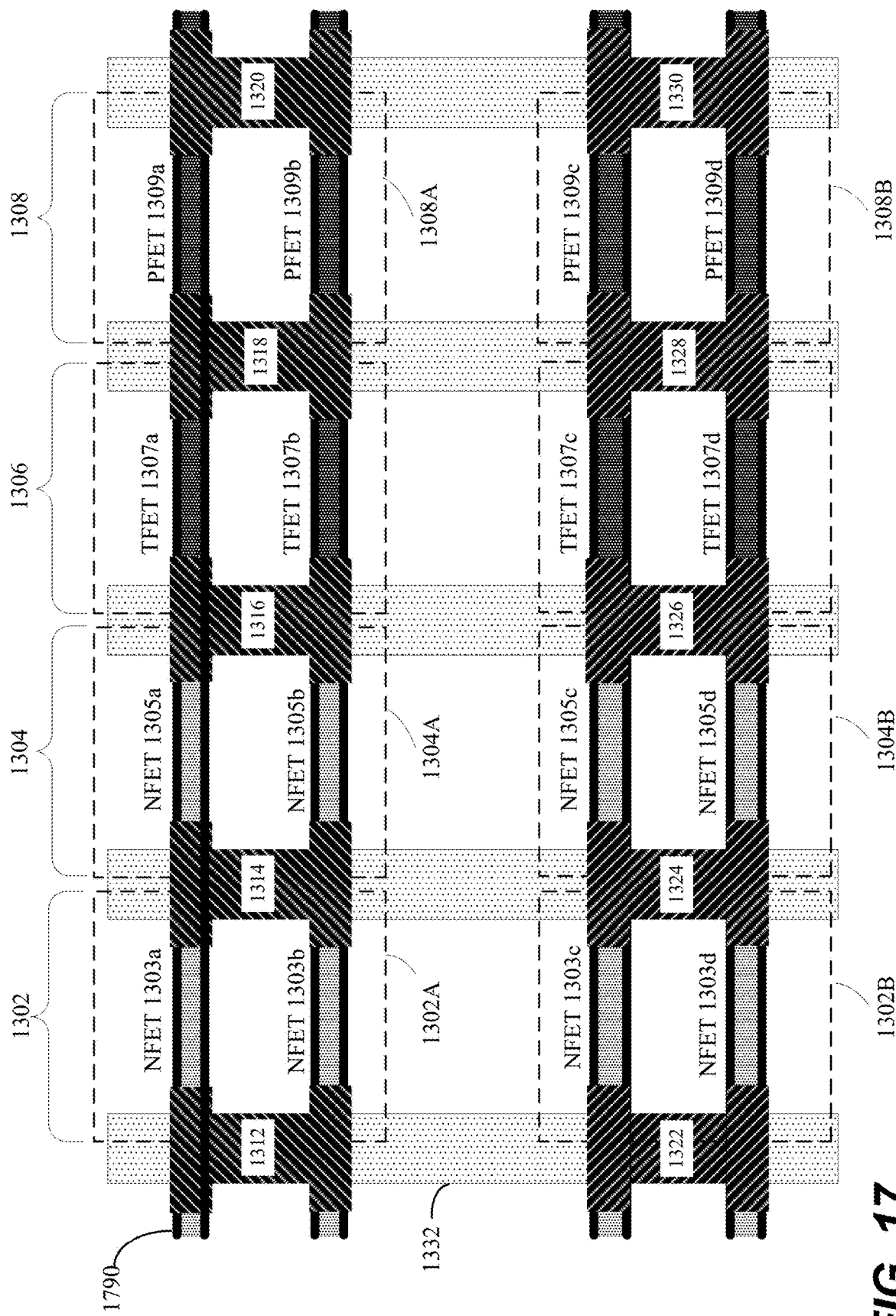
FIG. 17 illustrates a layer of deposited dielectric on the nano-channels of FIG. 16.

A first dielectric layer 1790 is deposited on the channels to a first predetermined thickness of dielectric, wherein the dielectric is deposited all around a cross-section of the channels as illustrated in FIG. 17.

The process steps then proceed to those previously described in either the first and second aspect to form oxide layers, high-k layers capping and metallization layers to further modify the high and low threshold regions.

Thus, techniques herein provide devices and processes to microfabricate transistors with multiple different threshold voltages. Source/drain regions may be formed by masking the substrate leaving a lower source/drain area uncovered for growing doped S/D (either n-type or p-type). A lower plane of source/drain regions can then be covered and an upper plane can be selectively uncovered for growing a given type of source/drain region. Additional steps to complete the FET devices can include forming local interconnects, followed by additional metallization (not shown). The completion process continues with established processes to finish with TiN, TaN, TiAl depositions, replacement metal gate P-type work function metal (RMG PWFM) removal, RMG final, gate cut, and forming contacts for M0, M1 connections.

The first embodiment is illustrated with respect to FIG. 1-4, 5A, 5B. The first embodiment is drawn to a method of microfabrication, the method comprising receiving a substrate having channels for gate-all-around field-effect transistor devices, the channels including vertical stacks of channels (102, 104, 106, 108) positioned adjacent to each other, in which individual channels (103a-d, 105a-d, 107a-d, 109a-d) extend horizontally between source/drain regions (for example, channels 103a and 103b extending between source/drain regions 112 and 114), wherein, in the vertical stacks of channels, at least one channel is positioned above a second channel (for example, 103a is above 103b and 103b is above 103c, FIG. 1), depositing a dielectric 242 (e.g.

silicon dioxide) on the channels to a first predetermined thickness, wherein the dielectric is deposited all around a cross-section of the channels as shown in FIG. 2, masking a first portion of the channels with a first etch mask 340, a second portion of the channels being uncovered, as shown in FIG. 3, removing deposited dielectric from the second portion of the channels as shown in FIG. 4, removing the first etch mask so that the channels are uncovered, and depositing a high-k layer 552 (e.g. $HfO_2$) on the channels, wherein the high-k material is deposited all around the cross-section of the channels as shown in FIG. 5A, wherein field-effect transistors using the first portion of channels have a greater threshold voltage as compared to the field-effect transistors using the second portion of the channels.

Removing the deposited dielectric includes removing a second predetermined thickness of the deposited dielectric resulting in the first portion of the channels having the first predetermined thickness of dielectric and the second portion of the channels having a third predetermined thickness of dielectric, the first predetermined thickness of dielectric being greater than the third predetermined thickness of dielectric.

The method includes depositing an interfacial layer of dielectric 550 all around a cross-section of the channels subsequent to removing the first etch mask and prior to depositing the high-k material 552.

The method further comprises depositing work function metal layers 554 subsequent to depositing the high-k material, wherein the work function metal layers include a first work function metal layer of titanium nitride, TiN, and a second work function metal layer of tantalum nitride, TaN, wherein the TaN layer is deposited over the TiN layer.

The method includes one of depositing a third work function metal layer of titanium oxy nitride, TiON, over the TaN layer; depositing a third work function metal layer of titanium carbide, TiC, over the TaN layer and further comprising depositing a third work function metal layer of titanium aluminum, TiAl, over the TaN layer.

The method includes selecting the high-k material from the group including $HfO_2$, $Al_2O_3$, $Y_2O_3$ and $ZrO_2$.

The method includes depositing the dielectric, the high-k material and work function metals by one or more deposition methods selected from the group of chemical vapor deposition (CVD), physical vapor deposition (PVD), atomic layer deposition (ALD), diffusion and low pressure CVD.

The second embodiment is illustrated with respect to FIG. 6-11, 12A, 12B. The second embodiment is drawn to a method of microfabrication, the method comprising receiving a substrate 600 having channels for gate-all-around field-effect transistor devices, the channels including vertical stacks of channels (602, 604, 606, 608) positioned adjacent to each other, in which individual channels (603a-d, 605a-d, 607a-d, 609a-d) extend horizontally between source/drain regions (for example, channels 603a and 603b extending between source/drain regions 612 and 614), wherein, in the vertical stacks of channels, at least one channel is positioned above a second channel (for example, 603a is above 603b and 603b is above 603c, FIG. 6), depositing a first layer of dielectric 742 on the channels to a first predetermined thickness of dielectric, wherein the first layer of dielectric is deposited all around a cross-section of the channels as shown in FIG. 7, depositing a high-k material 852 on the channels to a first predetermined thickness of high-k material, wherein the high-k material is deposited all around a cross-section of the channels as shown in FIG. 8, depositing a second layer of dielectric 956 on the channels to a second predetermined thickness of dielectric, wherein the second layer of dielectric is deposited all around a cross-section of the channels as shown in FIG. 9.

The method of the third embodiment continues by masking a first portion of the channels with a first etch mask 1040, a second portion of the channels being uncovered as shown in FIG. 10, removing the second layer of dielectric from the second portion of the channels as shown in FIG. 11, wherein field-effect transistors using the first portion of channels have a greater threshold voltage as compared to field-effect transistors using the second portion of the channels.

The method proceeds by removing the first etch mask as shown in FIG. 12A.

The method includes selecting the high-k material 852 from the group including HfO2, Al2O3, Y2O3 and ZrO2.

The method includes masking the first portion of channels with the first etch mask 1040 by depositing an amorphous silicon layer over the second gate oxide layer, depositing a silicon nitride, SiN, layer over the amorphous silicon layer and depositing a resist layer over the SiN layer.

The method continues by depositing work function metal layers (not shown) subsequent to removing the etch mask, wherein the work function metal layers include a first work function metal layer of titanium nitride, TiN, a second work function metal layer of tantalum nitride, TaN, deposited over the TiN layer and a third work function metal layer of titanium aluminum TiAl, deposited over the TaN layer.

The method includes depositing the first dielectric layer 742, the high-k material 852, the second dielectric layer 956 and the work function metal layers by one or more deposition methods selected from the group of chemical vapor deposition (CVD), physical vapor deposition (PVD), atomic layer deposition (ALD), diffusion and low pressure CVD.

The third embodiment is illustrated with respect to FIG. 13-17. The third embodiment is drawn to a method of microfabrication, the method comprising receiving a substrate 1300 having channels (1303a-d, 1305a-d, 1309a-d) for gate-all-around field-effect transistor devices, the channels including vertical stacks (1302, 1304, 1306, 1308, FIG. 13) of channels positioned adjacent to each other in which individual channels extend horizontally between source/drain regions (1312, 1314, 1316, 1318, 1320, 1322, 1324, 1326, 1328, 1330, FIG. 13), wherein, in the vertical stacks of channels, at least one channel is positioned above a second channel (for example, 1303a is above 1303b and 1303b is above 1303c). The method includes masking a first portion (1309a-d) of the channels with a first etch mask 1340, a second portion (1303a-d, 1305a-d) of the channels being uncovered and executing a first plasma doping process 1360 that dopes the second portion of the channels (as seen in FIG. 13-14, where the channels in stacks 1302 and 1304 are shaded). The method continues by uncovering the first portion of the channels as shown in FIG. 14, then masking the second portion of the channels with a second etch mask 1570 and executing a second plasma doping process 1580 that dopes the first portion of the channels resulting in the second portion of channels having a different threshold voltage as compared to the first portion of channels and removing the second etch mask as shown in FIG. 15-16, and depositing a first dielectric layer 1790 on all channels to a first predetermined thickness of dielectric, wherein the dielectric is deposited all around a cross-section of the channels as shown in FIG. 17.

The method further comprises annealing the substrate subsequent to plasma doping and prior to depositing the first dielectric layer.

The method further comprises depositing a high-k material on the channels to a first predetermined thickness of high-k material, wherein the high-k material is deposited all around a cross-section of the channels and depositing a second layer of dielectric on the channels to a second predetermined thickness of dielectric, wherein the second layer of dielectric is deposited all around a cross-section of the channels.

The method further comprises depositing work function metal layers subsequent to depositing the second layer of dielectric, wherein the work function metal layers include a first work function metal layer of titanium nitride, TiN, a second work function metal layer of tantalum nitride, TaN, deposited over the TiN layer and a third work function metal layer of titanium aluminum TiAl, deposited over the TaN layer.

The method further comprises depositing the first dielectric layer, the high-k material, the second dielectric layer and the work function metal layers by one or more deposition methods selected from the group of chemical vapor deposition (CVD), physical vapor deposition (PVD), atomic layer deposition (ALD), diffusion and low pressure CVD.

Accordingly, techniques herein provide more $Id_{sat}$ (drive current) that is available per area of chip layout. Multiple $V_t$s can be provided for low voltage and high voltage areas with multiple gate oxide thickness for both LV and HV. New transistor architectures herein enable N=1 to N≥10 substrate planes of transistors depending on circuit requirements.

Tunneling field-effect transistors (TFET) can be co-integrated with emerging CFET (complementary FET (GAA stacked transistor device)) without any additional process steps. The tunneling transistor can be used for future scaling for low power and channel length scaling.

Techniques herein provide a cost-effective dual gate process for CFET fabrication. Both p-channel and n-channel devices can be fabricated in a same epi stack with selective source/drains. Transistor channels can also be doped after nanosheet stack formation and after S/D doping as an option with one mask and one plasma implant.

Both high voltage and low voltage devices, with multiple Vt and gate oxide thickness are herein disclosed for 3D memory circuits with 3D logic circuits and for many other circuits designs.

Obviously, numerous modifications and variations of the present disclosure are possible in light of the above teachings. It is therefore to be understood that within the scope of the appended claims, the invention may be practiced otherwise than as specifically described herein.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method of microfabrication, the method comprising:
receiving a substrate having channels for gate-all-around field-effect transistor devices, the channels including vertical stacks of channels positioned adjacent to each other in which individual channels extend horizontally between source/drain regions, wherein, in the vertical stacks of channels, at least one channel is positioned above a second channel;
depositing a first layer of dielectric on the channels to a first thickness, wherein the first layer of dielectric is deposited all around a cross-section of the channels;
depositing a high-k material on the channels to a first thickness of high-k material, wherein the high-k material is deposited all around a cross-section of the channels;
depositing a second layer of dielectric on the channels to a second thickness, wherein the second layer of dielectric is deposited all around a cross-section of the channels;
masking a first portion of the channels with a first etch mask, a second portion of the channels being uncovered; and
removing the second layer of dielectric from the second portion of the channels, wherein field-effect transistors using the first portion of channels have a greater threshold voltage as compared to field-effect transistors using the second portion of the channels.

2. The method of microfabrication of claim 1, further comprising removing the first etch mask.

3. The method of claim 2, further comprising depositing work function metal layers subsequent to removing the first etch mask, wherein the work function metal layers include a first work function metal layer of titanium nitride, TiN, a second work function metal layer of tantalum nitride, TaN, deposited over the TiN layer and a third work function metal layer of titanium aluminum, TiAl, deposited over the TaN layer.

4. The method of claim 3, further comprising depositing the first layer of dielectric, the high-k material, the second layer of dielectric and the work function metal layers by one or more deposition methods selected from the group of chemical vapor deposition (CVD), physical vapor deposition (PVD), atomic layer deposition (ALD), diffusion and low pressure CVD.

5. The method of microfabrication of claim 1, further comprising selecting the high-k material from the group including $HfO_2$, $Al_2O_3$, $Y_2O_3$ and $ZrO_2$.

6. The method of microfabrication of claim 1, further comprising masking the first portion of channels with the first etch mask by depositing an amorphous silicon layer over the second layer of dielectric, depositing a silicon nitride, SiN, layer over the amorphous silicon layer and depositing a resist layer over the SiN layer.

* * * * *